US008454750B1

(12) United States Patent
Shrinivasan et al.

(10) Patent No.: US 8,454,750 B1
(45) Date of Patent: Jun. 4, 2013

(54) MULTI-STATION SEQUENTIAL CURING OF DIELECTRIC FILMS

(75) Inventors: Krishnan Shrinivasan, San Jose, CA (US); Michael Rivkin, Sunnyvale, CA (US); Eugene Smargiassi, Tualatin, OR (US); Mohamed Sabri, Beaverton, OR (US)

(73) Assignee: Novellus Systems, Inc., Fremont, CA (US)

( * ) Notice: Subject to any disclaimer, the term of this patent is extended or adjusted under 35 U.S.C. 154(b) by 435 days.

(21) Appl. No.: 11/688,695

(22) Filed: Mar. 20, 2007

Related U.S. Application Data

(63) Continuation-in-part of application No. 11/369,311, filed on Mar. 6, 2006, which is a continuation-in-part of application No. 11/115,576, filed on Apr. 26, 2005, now Pat. No. 8,137,465.

(51) Int. Cl.
| | |
|---|---|
| C23C 16/48 | (2006.01) |
| C23C 16/458 | (2006.01) |
| C23F 1/00 | (2006.01) |
| H01L 21/306 | (2006.01) |
| C23C 16/06 | (2006.01) |
| C23C 16/22 | (2006.01) |

(52) U.S. Cl.
USPC .................. 118/719; 156/345.31; 156/345.54

(58) Field of Classification Search
USPC .......................... 118/719; 156/345.31, 345.54
See application file for complete search history.

(56) References Cited

U.S. PATENT DOCUMENTS

| | | | |
|---|---|---|---|
| 3,504,181 A | 3/1970 | Campbell et al. | |
| 3,983,385 A | 9/1976 | Troue | |
| 4,313,969 A | 2/1982 | Matthews et al. | |
| 4,357,451 A | 11/1982 | McDaniel | |
| 4,391,663 A | 7/1983 | Hutter, III | |
| 4,527,620 A | 7/1985 | Pedersen et al. | |
| 4,563,589 A | 1/1986 | Scheffer | |

(Continued)

FOREIGN PATENT DOCUMENTS

| | | |
|---|---|---|
| CN | 102074500 | 5/2011 |
| JP | 62-229833 | 10/1987 |

(Continued)

OTHER PUBLICATIONS

Cho et al., "Plasma Treatments of Molecularly Templated Nanoporous Silica Films," Electrochemical and Solid-State Letters, 4 (4) G35-G38 (2001).

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

(Continued)

*Primary Examiner* — Rudy Zervigon
(74) *Attorney, Agent, or Firm* — Weaver Austin Villeneuve & Sampson, LLP (57) ABSTRACT

The present invention addresses provides improved methods of preparing a low-k dielectric material on a substrate. The methods involve multiple operation ultraviolet curing processes in which UV intensity, wafer substrate temperature and other conditions may be independently modulated in each operation. In certain embodiments, a film containing a structure former and a porogen is exposed to UV radiation in a first operation to facilitate removal of the porogen and create a porous dielectric film. In a second operation, the film is exposed to UV radiation to increase cross-linking within the porous film. In certain embodiments, the curing takes place in a multi-station UV chamber wherein UV intensity and substrate temperature may be independently controlled at each station.

22 Claims, 4 Drawing Sheets

U.S. PATENT DOCUMENTS

| | | | |
|---|---|---|---|
| 4,654,226 A | 3/1987 | Jackson et al. | |
| 4,751,191 A | 6/1988 | Gonsiorawski et al. | |
| 4,837,289 A | 6/1989 | Mueller et al. | |
| 4,872,947 A | 10/1989 | Wang et al. | |
| 4,885,262 A | 12/1989 | Ting et al. | |
| 5,005,519 A | 4/1991 | Egermeier et al. | |
| 5,049,739 A | 9/1991 | Okamoto | |
| 5,150,253 A | 9/1992 | Watanuki et al. | |
| 5,166,101 A | 11/1992 | Lee et al. | |
| 5,174,881 A | 12/1992 | Iwasaki et al. | |
| 5,178,682 A | 1/1993 | Tsukamoto et al. | |
| 5,249,076 A | 9/1993 | Fujiwara et al. | |
| 5,268,320 A | 12/1993 | Holler et al. | |
| 5,282,121 A | 1/1994 | Bornhorst et al. | |
| 5,288,684 A | 2/1994 | Yamazaki et al. | |
| 5,298,939 A | 3/1994 | Swanson et al. | |
| 5,354,715 A | 10/1994 | Wang et al. | |
| 5,364,667 A | 11/1994 | Rhieu | |
| 5,413,664 A | 5/1995 | Yagi et al. | |
| 5,426,076 A | 6/1995 | Moghadam | |
| 5,504,042 A | 4/1996 | Cho et al. | |
| 5,518,959 A | 5/1996 | Jang et al. | |
| 5,552,927 A | 9/1996 | Wheatly et al. | |
| 5,582,880 A | 12/1996 | Mochizuki et al. | |
| 5,667,592 A * | 9/1997 | Boitnott et al. | 118/719 |
| 5,674,783 A | 10/1997 | Jang et al. | |
| 5,686,054 A | 11/1997 | Barthel et al. | |
| 5,700,844 A | 12/1997 | Hedrick et al. | |
| 5,734,187 A | 3/1998 | Bohr et al. | |
| 5,789,027 A | 8/1998 | Watkins et al. | |
| 5,795,448 A | 8/1998 | Hurwitt et al. | |
| 5,812,403 A | 9/1998 | Fong et al. | |
| 5,833,290 A | 11/1998 | Curelop et al. | |
| 5,840,600 A | 11/1998 | Yamazaki et al. | |
| 5,851,715 A | 12/1998 | Barthel et al. | |
| 5,858,457 A | 1/1999 | Brinker et al. | |
| 5,876,798 A | 3/1999 | Vassiliev | |
| 5,877,095 A | 3/1999 | Tamura et al. | |
| 5,962,085 A | 10/1999 | Hayashi et al. | |
| 6,015,503 A * | 1/2000 | Butterbaugh et al. | 216/66 |
| 6,044,329 A | 3/2000 | Kidd | |
| 6,080,965 A | 6/2000 | Osawa | |
| 6,090,442 A | 7/2000 | Klaus et al. | |
| 6,098,637 A | 8/2000 | Parke | |
| 6,132,814 A | 10/2000 | Livesay et al. | |
| 6,136,680 A | 10/2000 | Lai et al. | |
| 6,140,252 A | 10/2000 | Cho et al. | |
| 6,143,063 A | 11/2000 | Hayashi et al. | |
| 6,150,272 A | 11/2000 | Liu et al. | |
| 6,228,563 B1 | 5/2001 | Starov et al. | |
| 6,232,248 B1 * | 5/2001 | Shinriki et al. | 438/785 |
| 6,235,112 B1 | 5/2001 | Satoh | |
| 6,242,717 B1 | 6/2001 | Sanderson | |
| 6,244,575 B1 | 6/2001 | Vaartstra et al. | |
| 6,254,689 B1 | 7/2001 | Meder | |
| 6,259,061 B1 | 7/2001 | Osawa | |
| 6,268,288 B1 | 7/2001 | Hautala et al. | |
| 6,270,846 B1 | 8/2001 | Brinker et al. | |
| 6,271,273 B1 | 8/2001 | You et al. | |
| 6,280,171 B1 | 8/2001 | Buazza | |
| 6,284,050 B1 | 9/2001 | Shi et al. | |
| 6,290,589 B1 | 9/2001 | Tolles | |
| 6,291,800 B1 | 9/2001 | Shirakawa et al. | |
| 6,329,017 B1 | 12/2001 | Liu et al. | |
| 6,329,062 B1 | 12/2001 | Gaynor | |
| 6,333,268 B1 | 12/2001 | Starov et al. | |
| 6,340,628 B1 | 1/2002 | Van Cleemput et al. | |
| 6,348,407 B1 | 2/2002 | Gupta et al. | |
| 6,365,266 B1 | 4/2002 | MacDougall et al. | |
| 6,367,412 B1 | 4/2002 | Ramaswamy et al. | |
| 6,383,466 B1 | 5/2002 | Domansky et al. | |
| 6,383,955 B1 | 5/2002 | Matsuki et al. | |
| 6,386,466 B1 | 5/2002 | Ozawa et al. | |
| 6,387,453 B1 | 5/2002 | Brinker et al. | |
| 6,391,932 B1 | 5/2002 | Gore et al. | |
| 6,392,017 B1 | 5/2002 | Chandrashekar | |
| 6,394,797 B1 | 5/2002 | Sugaya et al. | |
| 6,399,212 B1 | 6/2002 | Sakai et al. | |
| 6,407,007 B1 | 6/2002 | Tsan et al. | |
| 6,420,441 B1 | 7/2002 | Allen et al. | |
| 6,444,715 B1 | 9/2002 | Mukherjee et al. | |
| 6,467,491 B1 * | 10/2002 | Sugiura et al. | 134/1.3 |
| 6,475,854 B2 | 11/2002 | Narwankar et al. | |
| 6,479,374 B1 | 11/2002 | Ioka et al. | |
| 6,479,409 B2 | 11/2002 | Shioya et al. | |
| 6,485,599 B1 | 11/2002 | Glownia et al. | |
| 6,518,130 B1 | 2/2003 | Ohno | |
| 6,524,389 B1 | 2/2003 | Katayama et al. | |
| 6,530,380 B1 | 3/2003 | Zhou et al. | |
| 6,531,193 B2 | 3/2003 | Fonash et al. | |
| 6,534,395 B2 | 3/2003 | Werkhoven et al. | |
| 6,548,113 B1 | 4/2003 | Birnbaum et al. | |
| 6,558,755 B2 | 5/2003 | Berry et al. | |
| 6,563,092 B1 | 5/2003 | Shrinivasan et al. | |
| 6,566,278 B1 | 5/2003 | Harvey et al. | |
| 6,576,300 B1 | 6/2003 | Berry et al. | |
| 6,596,654 B1 | 7/2003 | Bayman et al. | |
| 6,629,012 B1 | 9/2003 | Riley et al. | |
| 6,635,575 B1 | 10/2003 | Xia et al. | |
| 6,644,786 B1 | 11/2003 | Leben | |
| 6,677,251 B1 | 1/2004 | Lu et al. | |
| 6,740,602 B1 | 5/2004 | Hendriks et al. | |
| 6,740,605 B1 | 5/2004 | Shiraiwa et al. | |
| 6,756,085 B2 | 6/2004 | Waldfried et al. | |
| 6,759,098 B2 | 7/2004 | Han et al. | |
| 6,770,866 B2 | 8/2004 | Retschke et al. | |
| 6,797,643 B2 | 9/2004 | Rocha-Alvarez et al. | |
| 6,800,546 B2 | 10/2004 | Konishi et al. | |
| 6,805,801 B1 | 10/2004 | Humayun et al. | |
| 6,812,043 B2 | 11/2004 | Bao et al. | |
| 6,821,906 B2 | 11/2004 | Wada et al. | |
| 6,830,624 B2 | 12/2004 | Janakiraman et al. | |
| 6,831,284 B2 | 12/2004 | Demos et al. | |
| 6,835,417 B2 | 12/2004 | Saenger et al. | |
| 6,848,458 B1 | 2/2005 | Shrinivasan et al. | |
| 6,856,712 B2 | 2/2005 | Fauver et al. | |
| 6,884,738 B2 | 4/2005 | Asai et al. | |
| 6,899,857 B2 | 5/2005 | Pheng et al. | |
| 6,900,413 B2 | 5/2005 | Ratliff et al. | |
| 6,902,440 B2 | 6/2005 | Dougan et al. | |
| 6,921,727 B2 | 7/2005 | Chiang et al. | |
| 6,958,301 B2 | 10/2005 | Kim et al. | |
| 6,967,160 B1 | 11/2005 | Paton et al. | |
| 7,005,390 B2 | 2/2006 | Ramachandrarao et al. | |
| 7,017,514 B1 | 3/2006 | Shepherd et al. | |
| 7,018,479 B2 | 3/2006 | Goodwin | |
| 7,018,918 B2 | 3/2006 | Kloster et al. | |
| 7,020,238 B1 | 3/2006 | Kantonen et al. | |
| 7,025,831 B1 | 4/2006 | Butterbaugh et al. | |
| 7,030,041 B2 | 4/2006 | Li et al. | |
| 7,067,819 B2 | 6/2006 | Janik | |
| 7,087,497 B2 | 8/2006 | Yuan et al. | |
| 7,094,713 B1 | 8/2006 | Niu et al. | |
| 7,097,712 B1 | 8/2006 | Yamazaki et al. | |
| 7,112,541 B2 | 9/2006 | Xia et al. | |
| 7,132,334 B2 | 11/2006 | Lin | |
| 7,144,606 B2 | 12/2006 | Huang | |
| 7,148,155 B1 | 12/2006 | Tarafdar et al. | |
| 7,160,813 B1 | 1/2007 | Chen et al. | |
| 7,166,531 B1 | 1/2007 | van den Hoek et al. | |
| 7,176,144 B1 | 2/2007 | Wang et al. | |
| 7,195,548 B1 | 3/2007 | Hardikar et al. | |
| 7,208,389 B1 | 4/2007 | Tipton et al. | |
| 7,214,630 B1 | 5/2007 | Varadarajan et al. | |
| 7,235,459 B2 | 6/2007 | Sandhu | |
| 7,241,704 B1 | 7/2007 | Wu et al. | |
| 7,244,672 B2 | 7/2007 | Nguyen et al. | |
| 7,247,582 B2 | 7/2007 | Stern et al. | |
| 7,253,125 B1 | 8/2007 | Bandyopadhyay et al. | |
| 7,256,111 B2 | 8/2007 | Lopatin et al. | |
| 7,265,061 B1 | 9/2007 | Cho et al. | |
| 7,301,148 B2 | 11/2007 | Johnson | |
| 7,304,302 B1 | 12/2007 | Nunan et al. | |
| 7,332,445 B2 | 2/2008 | Lukas et al. | |
| 7,381,659 B2 | 6/2008 | Nguyen et al. | |
| 7,390,537 B1 | 6/2008 | Wu et al. | |
| 7,394,067 B1 | 7/2008 | Soltz et al. | |

| Patent/Pub No. | Date | Inventors |
|---|---|---|
| 7,402,532 B2 | 7/2008 | Clevenger et al. |
| 7,453,560 B2 | 11/2008 | Miyake |
| 7,481,882 B2 | 1/2009 | Won et al. |
| 7,504,663 B2 | 3/2009 | Yamazaki et al. |
| 7,510,982 B1 | 3/2009 | Draeger et al. |
| 7,611,757 B1 | 11/2009 | Bandyopadhyay et al. |
| 7,622,162 B1 | 11/2009 | Schravendijk et al. |
| 7,638,780 B2 | 12/2009 | Kilburn et al. |
| 7,642,205 B2 | 1/2010 | Timans |
| 7,704,894 B1 | 4/2010 | Henry et al. |
| 7,705,431 B1 | 4/2010 | Sanganeria et al. |
| 7,772,527 B2 | 8/2010 | Choi |
| 7,790,243 B2 | 9/2010 | Radhakrishnan et al. |
| 7,790,633 B1 | 9/2010 | Tarafdar et al. |
| 7,851,232 B2 | 12/2010 | van Schravendijk et al. |
| 7,858,533 B2 | 12/2010 | Liu et al. |
| 7,906,174 B1 | 3/2011 | Wu et al. |
| 7,935,940 B1 | 5/2011 | Smargiassi |
| 7,960,297 B1 | 6/2011 | Rivkin et al. |
| 7,993,937 B2 | 8/2011 | Chen et al. |
| 8,043,667 B1 | 10/2011 | Bandyopadhyay et al. |
| 8,058,181 B1 | 11/2011 | Chen et al. |
| 8,062,983 B1 | 11/2011 | Draeger et al. |
| 8,075,789 B1 | 12/2011 | Littau et al. |
| 8,137,465 B1 | 3/2012 | Shrinivasan et al. |
| 8,211,510 B1 | 7/2012 | Varadarajan et al. |
| 8,242,028 B1 | 8/2012 | van Schravendijk et al. |
| 8,283,644 B2 | 10/2012 | Smargiassi et al. |
| 2001/0001501 A1 | 5/2001 | Lee et al. |
| 2001/0014512 A1 | 8/2001 | Lyons et al. |
| 2001/0018267 A1 | 8/2001 | Shinriki et al. |
| 2002/0001973 A1 | 1/2002 | Wu et al. |
| 2002/0015850 A1 | 2/2002 | Nakamura et al. |
| 2002/0016085 A1 | 2/2002 | Huang et al. |
| 2002/0017242 A1 | 2/2002 | Hamaguchi et al. |
| 2002/0034626 A1 | 3/2002 | Liu et al. |
| 2002/0052124 A1 | 5/2002 | Raaijmakers et al. |
| 2002/0064341 A1 | 5/2002 | Fauver et al. |
| 2002/0106500 A1 | 8/2002 | Albano et al. |
| 2002/0117109 A1 | 8/2002 | Hazelton et al. |
| 2002/0123218 A1 | 9/2002 | Shioya et al. |
| 2002/0123240 A1 | 9/2002 | Gallagher et al. |
| 2002/0134439 A1 | 9/2002 | Kawasaki et al. |
| 2002/0148563 A1 | 10/2002 | Carlson et al. |
| 2002/0172766 A1 | 11/2002 | Laxman et al. |
| 2002/0187627 A1 | 12/2002 | Yuang |
| 2002/0195683 A1 | 12/2002 | Kim et al. |
| 2003/0013280 A1 | 1/2003 | Yamanaka |
| 2003/0015764 A1 | 1/2003 | Raaijmakers et al. |
| 2003/0064604 A1 | 4/2003 | Umeda |
| 2003/0064607 A1 | 4/2003 | Leu et al. |
| 2003/0068881 A1 | 4/2003 | Xia et al. |
| 2003/0134038 A1 | 7/2003 | Paranjpe |
| 2003/0157248 A1 | 8/2003 | Watkins et al. |
| 2003/0157267 A1 | 8/2003 | Waldfried et al. |
| 2003/0194493 A1 | 10/2003 | Chang et al. |
| 2003/0199603 A1 | 10/2003 | Walker et al. |
| 2003/0200931 A1 | 10/2003 | Goodwin |
| 2003/0227087 A1 | 12/2003 | Kakamu et al. |
| 2003/0228769 A1 | 12/2003 | Chen et al. |
| 2003/0228770 A1 | 12/2003 | Lee et al. |
| 2004/0004247 A1 | 1/2004 | Forbes et al. |
| 2004/0018319 A1 | 1/2004 | Waldfried et al. |
| 2004/0022960 A1 | 2/2004 | Rhee et al. |
| 2004/0023513 A1 | 2/2004 | Aoyama et al. |
| 2004/0029391 A1 | 2/2004 | Kirkpatrick et al. |
| 2004/0033662 A1 | 2/2004 | Lee et al. |
| 2004/0058090 A1 | 3/2004 | Waldfried et al. |
| 2004/0062633 A1 | 4/2004 | Rice et al. |
| 2004/0069410 A1 | 4/2004 | Moghadam et al. |
| 2004/0072405 A1 | 4/2004 | Yao et al. |
| 2004/0082163 A1 | 4/2004 | Mori et al. |
| 2004/0096593 A1 | 5/2004 | Lukas et al. |
| 2004/0096672 A1 | 5/2004 | Lukas et al. |
| 2004/0099915 A1 | 5/2004 | Takayama et al. |
| 2004/0099952 A1 | 5/2004 | Goodner et al. |
| 2004/0101633 A1 | 5/2004 | Zheng et al. |
| 2004/0102031 A1 | 5/2004 | Kloster et al. |
| 2004/0115933 A1 | 6/2004 | Jung et al. |
| 2004/0152239 A1 | 8/2004 | Bao et al. |
| 2004/0166240 A1 | 8/2004 | Rhee et al. |
| 2004/0175501 A1 | 9/2004 | Lukas et al. |
| 2004/0175957 A1 | 9/2004 | Lukas et al. |
| 2004/0185679 A1 | 9/2004 | Ott et al. |
| 2004/0221871 A1 | 11/2004 | Fletcher et al. |
| 2004/0224496 A1 | 11/2004 | Cui et al. |
| 2004/0266214 A1* | 12/2004 | Suguro et al. .................. 438/771 |
| 2005/0006916 A1 | 1/2005 | Mantz |
| 2005/0016687 A1 | 1/2005 | Shinriki et al. |
| 2005/0025892 A1 | 2/2005 | Satoh et al. |
| 2005/0026454 A1 | 2/2005 | Konishi et al. |
| 2005/0032293 A1 | 2/2005 | Clark et al. |
| 2005/0064712 A1 | 3/2005 | Andreas |
| 2005/0064726 A1 | 3/2005 | Reid et al. |
| 2005/0072716 A1 | 4/2005 | Quiles et al. |
| 2005/0079717 A1 | 4/2005 | Savas et al. |
| 2005/0085094 A1 | 4/2005 | Yoo |
| 2005/0095840 A1 | 5/2005 | Bhanap et al. |
| 2005/0098553 A1 | 5/2005 | Devine et al. |
| 2005/0101154 A1 | 5/2005 | Huang |
| 2005/0112282 A1 | 5/2005 | Gordon et al. |
| 2005/0153533 A1 | 7/2005 | Hoshino et al. |
| 2005/0156285 A1 | 7/2005 | Gates et al. |
| 2005/0161821 A1 | 7/2005 | Lee et al. |
| 2005/0164497 A1 | 7/2005 | Lopatin et al. |
| 2005/0170104 A1 | 8/2005 | Jung et al. |
| 2005/0191803 A1 | 9/2005 | Matsuse et al. |
| 2005/0194619 A1 | 9/2005 | Edelstein et al. |
| 2005/0196929 A1 | 9/2005 | Yuan et al. |
| 2005/0208758 A1 | 9/2005 | Lu et al. |
| 2005/0233598 A1 | 10/2005 | Jung et al. |
| 2005/0260357 A1 | 11/2005 | Olsen et al. |
| 2005/0260420 A1 | 11/2005 | Collins et al. |
| 2005/0263719 A1 | 12/2005 | Ohdaira et al. |
| 2005/0272220 A1 | 12/2005 | Waldfried et al. |
| 2006/0021568 A1 | 2/2006 | Matsumoto |
| 2006/0024976 A1 | 2/2006 | Waldfried et al. |
| 2006/0027929 A1 | 2/2006 | Cooney et al. |
| 2006/0046516 A1 | 3/2006 | Weber |
| 2006/0063662 A1 | 3/2006 | Hata et al. |
| 2006/0074153 A1 | 4/2006 | Boisseau et al. |
| 2006/0105106 A1 | 5/2006 | Balseanu et al. |
| 2006/0110936 A1 | 5/2006 | Hill et al. |
| 2006/0118817 A1 | 6/2006 | Haisma |
| 2006/0121208 A1 | 6/2006 | Siegel |
| 2006/0141806 A1 | 6/2006 | Waldfried et al. |
| 2006/0142143 A1 | 6/2006 | Abrevaya et al. |
| 2006/0145304 A1 | 7/2006 | Boyanov et al. |
| 2006/0189133 A1 | 8/2006 | Dimitrakopoulos et al. |
| 2006/0216839 A1 | 9/2006 | Shenesh et al. |
| 2006/0220251 A1 | 10/2006 | Kloster |
| 2006/0246672 A1 | 11/2006 | Chen et al. |
| 2006/0260538 A1 | 11/2006 | Ye et al. |
| 2006/0265868 A1 | 11/2006 | Rueger et al. |
| 2006/0269693 A1 | 11/2006 | Balseanu et al. |
| 2007/0015355 A1 | 1/2007 | Lin et al. |
| 2007/0032024 A1 | 2/2007 | Peidous et al. |
| 2007/0034159 A1 | 2/2007 | Komino et al. |
| 2007/0042581 A1 | 2/2007 | Sano et al. |
| 2007/0054504 A1 | 3/2007 | Chen et al. |
| 2007/0065578 A1 | 3/2007 | McDougall et al. |
| 2007/0105292 A1 | 5/2007 | Chen et al. |
| 2007/0132054 A1 | 6/2007 | Arghavani et al. |
| 2007/0134821 A1 | 6/2007 | Thakur et al. |
| 2007/0134907 A1 | 6/2007 | Ikeda et al. |
| 2007/0161230 A1 | 7/2007 | Chen et al. |
| 2007/0189961 A1 | 8/2007 | Iacopi et al. |
| 2007/0196011 A1 | 8/2007 | Cox et al. |
| 2007/0207624 A1 | 9/2007 | Chua |
| 2007/0215377 A1 | 9/2007 | Aoki |
| 2007/0218204 A1 | 9/2007 | Garg et al. |
| 2007/0222081 A1 | 9/2007 | Chen et al. |
| 2007/0224824 A1 | 9/2007 | Chen et al. |
| 2007/0228570 A1 | 10/2007 | Dimitrakopoulos et al. |
| 2007/0275569 A1 | 11/2007 | Moghadam et al. |
| 2007/0281497 A1 | 12/2007 | Liu et al. |
| 2007/0287240 A1 | 12/2007 | Chen et al. |
| 2008/0009141 A1 | 1/2008 | Dubois et al. |

| | | | |
|---|---|---|---|
| 2008/0020591 A1 | 1/2008 | Balseanu et al. | |
| 2008/0026579 A1 | 1/2008 | Lai et al. | |
| 2008/0132055 A1 | 6/2008 | Nguyen et al. | |
| 2008/0199977 A1 | 8/2008 | Weigel et al. | |
| 2008/0254643 A1 | 10/2008 | Clevenger et al. | |
| 2008/0286697 A1 | 11/2008 | Verhaverbeke et al. | |
| 2008/0305600 A1 | 12/2008 | Liao et al. | |
| 2008/0318437 A1 | 12/2008 | Kim et al. | |
| 2008/0318438 A1 | 12/2008 | Nakamura et al. | |
| 2009/0017640 A1 | 1/2009 | Huh et al. | |
| 2009/0039475 A1 | 2/2009 | Shioya | |
| 2009/0059406 A1 | 3/2009 | Powers et al. | |
| 2009/0278116 A1 | 11/2009 | Yamate | |
| 2010/0018460 A1 | 1/2010 | Singh et al. | |
| 2010/0055904 A1 | 3/2010 | Chen et al. | |
| 2010/0261349 A1 | 10/2010 | Van Schravendijk et al. | |
| 2010/0267231 A1 | 10/2010 | Van Schravendijk et al. | |
| 2010/0317198 A1 | 12/2010 | Antonelli et al. | |
| 2011/0045610 A1 | 2/2011 | Van Schravendijk et al. | |
| 2011/0070665 A1 | 3/2011 | Chen et al. | |
| 2011/0111533 A1 | 5/2011 | Varadarajan et al. | |
| 2011/0117678 A1 | 5/2011 | Varadarajan et al. | |
| 2012/0061718 A1 | 3/2012 | Yamazaki et al. | |
| 2012/0091097 A1 | 4/2012 | Chen et al. | |

FOREIGN PATENT DOCUMENTS

| | | |
|---|---|---|
| JP | 63307740 A * | 12/1988 |
| JP | 01-107519 | 4/1989 |
| JP | 09-306892 | 11/1997 |
| JP | 11214364 | 8/1999 |
| JP | 20060165573 | 6/2006 |
| JP | 63-307740 | 12/2008 |
| KR | 2000-0043888 | 7/2000 |
| TW | 201130045 | 9/2011 |
| TW | 201237959 | 9/2012 |
| WO | 2006/104583 | 10/2006 |
| WO | 2006/127463 | 11/2006 |
| WO | 2007/043206 | 4/2007 |
| WO | 2012/087620 | 6/2012 |

OTHER PUBLICATIONS

Watkins et al., "Mesoporous Materials and Methods," U.S. Appl. No. 10/301,013, filed Nov. 21, 2002, 34 Pages.

Justin F. Gaynor, "In-Situ Treatment of Low-K Films With a Silylating Agent After Exposure to Oxidizing Environments," U.S. Appl. No. 10/056,926, filed Jan. 24, 2002, 34 Pages.

Jan, C.H., et al, *90NM Generation, 300mm Wafer Low k ILD/Cu Interconnect Technology*, 2003 IEEE Interconnect Technology Conference.

Gangpadhyay et al., "The First International Surface Cleaning Workshop," Northeastern University, Nov. 11-14, 2002.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

U.S. Office Action mailed Sep. 7, 2004, from U.S. Appl. No. 10/672,311.

U.S. Office Action mailed Dec. 28, 2004, from U.S. Appl. No. 10/672,311.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

U.S. Office Action mailed Mar. 2, 2005, from U.S. Appl. No. 10/860,340.

U.S. Final Office Action mailed Jun. 13, 2005, from U.S. Appl. No. 10/860,340.

Draeger et al., "Creation of Porosity in Low-K Films by Photo-Disassociation of Imbedded Nanoparticles," U.S. Appl. No. 11/146,456, filed Jun. 6, 2005.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S. Final Office Action mailed Jul. 13, 2005, from U.S. Appl. No. 10/672,311.

U.S. Office Action mailed Jan. 10, 2006, from U.S. Appl. No. 10/672,311.

U.S. Office Action mailed Mar. 29, 2006, from U.S. Appl. No. 10/800,377.

Kelman et al., "Method for Reducing Stress in Porous Dielectric Films", U.S. Appl. No. 11/369,311, filed Mar. 6, 2006.

U.S. Office Action mailed Jun. 28, 2006, from U.S. Appl. No. 10/825,888.

U.S. Office Action mailed Dec. 27, 2006, from U.S. Appl. No. 10/825,888.

Cho et al., "Method and Apparatus for UV Exposure of Low Dielectric Constant Materials for Porogen Removal and Improved Mechanical Properties", Novellus Systems, Inc., U.S. Appl. No. 11/656,661, filed Jan. 22, 2007, pp. 1-28.

Shrinivasan et al., "Single-Chamber Sequential Curing of Semiconductor Wafers," Novellus Systems, Inc., U.S. Appl. No. 11/115,576, filed Apr. 26, 2005, pp. 1-29.

Kamian et al., "Ultra Violet Light Treatment Load Lock for Dielectric Films," Novellus Systems, Inc., U.S. Appl. No. 11/561,834, filed Nov. 20, 2006, pp. 1-25.

Schravendijk et al., "UV Treatment of Etch Stop and Hard Mask Films for Selectivity and Hermeticity Enhancement," Novellus Systems, Inc., U.S. Appl. No. 11/696,102, filed Apr. 3, 2007, pp. 1-22.

Vancouver et al., "PECVD Methods for Producing Ultra Low-K Dielectric Films Using UV Treatment," U.S. Appl. No. 11/608,056, filed Dec. 7, 2006, pp. 1-34.

Tarafdar et al., "Sequential Deposition/Anneal Film Densification Method", Novellus Systems, Inc., filed Sep. 11, 2006, U.S. Appl. No. 11/519,445, pp. 1-37.

Schravendijk, "UV Treatment of FSG Films to Improve Film Stability," Novellus Systems, Inc., U.S. Appl. No. 11/622,423, filed Jan. 11, 2007, pp. 1-31.

Schravendijk, et al., "UV Treatment of STI Films for Stress," Novellus Systems, Inc., U.S. Appl. No. 11/811,048, filed Jun. 7, 2007.

Notice of Allowance and Fee Due mailed May 22, 2006, from U.S. Appl. No. 10/672,311.

Allowed Claims from U.S. Appl. No. 10/672,311.

Notice of Allowance and Fee Due mailed Apr. 4, 2007, from U.S. Appl. No. 10/825,888.

Allowed Claims from U.S. Appl. No. 10/825,888.

Bandyopadhyay et al., "Method to Improve Mechanical Strength of Low-K Dielectric Film Using Modulated UV Exposure," Novellus Systems, Inc., U.S. Appl. No. 11/824,049, filed Jun. 28, 2007.

Notice of Allowance and Fee Due mailed Oct. 10, 2006, from U.S. Appl. No. 10/800,377.

Allowed Claims from U.S. Appl. No. 10/800,377.

U.S. Office Action mailed Nov. 28, 2007, from U.S. Appl. No. 10/807,680.

R.J. Lewis, Sr., Hawley's Condensed Chemical Dictionary, 12$^{th}$ Edition, Van Nostrad Reinhold Co., New York, 1993 (no month), excerpts pp. 916-918 & 1123-1124.

Notice of Allowance and Fee Due mailed Dec. 20, 2005, from U.S. Appl. No. 10/860,340.

Allowed Claims from U.S. Appl. No. 10/860,340.

U.S. Office Action mailed Dec. 12, 2007, from U.S. Appl. No. 11/146,456.

U.S. Office Action mailed Oct. 3, 2007, from U.S. Appl. No. 11/115,576.

Shaviv et al., "UV Treatment to Improve Integrity and Performance of Front End Dielectrics," Novellus Systems, Inc., U.S. Appl. No. 11/622,409, filed Jan. 11, 2007.

van Schravendijk et al., "UV Treatment for Carbon-Containing Low-K Dielectric Repair in Semiconductor Processing," Novellus Systems, Inc., U.S. Appl. No. 11/590,661, filed Oct. 30, 2006.

Varadarajan et al., "A Cascaded Cure Approach to Fabricate Highly Tensile Silicon Nitride Films," Novellus Systems, Inc., U.S. Appl. No. 11/897,838, filed Aug. 31, 2007.

Van den Hoek, et al., "VLSI Fabrication Processes for Introducing Pores Into Dielectric Materials," Novellus Systems, Inc., U.S. Appl. No. 11/606,340, filed Nov. 28, 2006.

U.S. Office Action mailed Jan. 10, 2008, from U.S. Appl. No. 11/622,423.
Bhadri Varadarajan et al., "Development of High Stress SiN Films for Use with Strained Silicon Technologies"; Proc. 68$^{th}$ Symp. on Semiconductors and IC Tech.; Kyoto 2005.
U.S. Office Action mailed Apr. 3, 2008, from U.S. Appl. No. 10/982,654.
U.S. Office Action mailed Sep. 19, 2008, from U.S. Appl. No. 11/824,049.
U.S. Final Office Action mailed Jul. 10, 2008, from U.S. Appl. No. 10/807,680.
U.S. Final Office Action mailed Jul. 25, 2008, from U.S. Appl. No. 11/146,456.
U.S. Final Office Action mailed Jul. 9, 2008, from U.S. Appl. No. 10/982,654.
U.S. Office Action mailed May 14, 2008, from U.S. Appl. No. 11/519,445.
U.S. Final Office Action mailed May 2, 2008, from U.S. Appl. No. 11/115,576.
U.S. Office Action mailed Oct. 17, 2008, from U.S. Appl. No. 11/115,576.
U.S. Office Action mailed Jul. 23, 2008, from U.S. Appl. No. 11/622,423.
U.S. Appl. No. 11/590,661, Office Action mailed Apr. 6, 2009.
U.S. Appl. No. 11/811,048, Office Action mailed Mar. 19, 2009.
Rodriquez, J.A. et al., "Evolution of the mechanical stress on PECVD silicon oxide films under thermal processing", Journal of Materials Science Letters 19, 2000, pp. 1399-1401.
U.S. Appl. No. 11/606,340, Office Action mailed Feb. 5, 2009.
U.S. Appl. No. 11/824,049, Office Action mailed Mar. 19, 2009.
U.S. Appl. No. 10/982,654, Office Action mailed Dec. 4, 2008.
U.S. Appl. No. 11/519,445, Office Action mailed Dec. 10, 2008.
U.S. Appl. No. 10/972,084, Office Action mailed Dec. 30, 2008.
U.S. Appl. No. 11/115,576, Office Action mailed Apr. 22, 2009.
Banthia et al., *Strain Engineering in Non-Volatile Memories*, Reed Business Information, 2007, six pages.
U.S. Appl. No. 11/391,134, *Purging of Porogen from UV Cure Chamber*, filed Mar. 2006.
U.S. Appl. No. 11/824,049, Notice of Allowance mailed Jun. 22, 2009.
U.S. Appl. No. 11/824,049, Allowed Claims.
Draeger et al., "Creation of Porosity in Low-K Films by Photo-Disassociation of Imbedded Nanoparticles," U.S. Appl. No. 12/369,384, filed Feb. 11, 2009.
U.S. Appl. No. 11/696,102, Office Action mailed Jul. 1, 2009.
Yu, J.J. et al., "UV Annealing of Ultrathin Tantalum Oxide Films", Applied Surface Science, V 186 (2002), 57-63.
U.S. Appl. No. 11/811,048, Allowed Claims.
U.S. Appl. No. 11/608,056, Office Action mailed Aug. 20, 2009.
Varadarajan et al., "Tensile dielectric films using UV curing", U.S. Appl. No. 10/972,084, filed Oct. 22, 2004.
P. Morin et al., "Tensile contact etch stop layer for nMOS performance enhancement: influence of the film morphology", ECS meeting, May 2005.
Takagi et al., "High Rate Deposition of a-Si:H and a-SiN$_x$:H by VHF PECVD", Vacuum, 51, 1998.
Smith, D.L et al., "Mechanism of SiN$_3$-SiH$_4$ Llasma", J. Electrochem. Soc., vol. 137 (2) 1990.
Nagayoshi et al., "Residual Stress of a Si$_{1-x}$N$_x$: H Films Prepared By Afterglow Plasma Chemical Vapor Deposition Technique", Jpn. J. Appl. Phys. vol. 31 (1992) pp. L867-L869 Part 2, No. 7A, Jul. 1, 1992.
Varadarajan et al., "Use of VHF RF plasma to deposit high tensile stress films with improved film properties for use in strained silicon technology", U.S. Appl. No. 11/975,473, filed Oct. 18, 2007.
U.S. Appl. No. 11/975,473, Office Action mailed Oct. 28, 2008.
U.S. Appl. No. 11/975,473, Office Action mailed Mar. 23, 2009.
Jiang et al., "Tensile dielectric films using UV curing", U.S. Appl. No. 11/899,683, filed Sep. 7, 2007.
U.S. Appl. No. 11/899,683, Office Action mailed May 29, 2009.
U.S. Appl. No. 11/519,445, Office Action mailed Aug. 26, 2009.
U.S. Appl. No. 11/622,409, Office Action mailed Jul. 1, 2009.
Haverkamp et al., "Enhancing adhesion of cap layer films", U.S. Appl. No. 11/731,581, filed Mar. 30, 2007.
U.S. Appl. No. 11/731,581, Office Action mailed Jun. 1, 2009.
U.S. Appl. No. 11/115,576, Office Action mailed Oct. 1, 2009.
U.S. Appl. No. 11/811,048, Notice of Allowance mailed Oct. 8, 2009.
Bandyopadhyay et al., "Method to Improve Mechanical Strength of Low-K Dielectric Film Using Modulated UV Exposure," Novellus Systems, Inc., U.S. Appl. No. 12/566,514, filed Sep. 24, 2009.
U.S. Appl. No. 11/622,409, Office Action mailed Nov. 5, 2009.
U.S. Appl. No. 11/519,445, Office Action mailed Nov. 4, 2009.
U.S. Appl. No. 10/972,084, Office Action mailed Nov. 27, 2009.
Haverkamp, et al., "Multi-Station Sequential Curing of Dielectric Films," Novellus Systems, Inc., U.S. Appl. No. 11/977,792, filed Oct. 25, 2007.
Haverkamp, et al., "Progressive UV Cure," Novellus Systems, Inc., U.S. Appl. No. 12/210,060, filed Sep. 12, 2008.
U.S. Appl. No. 11/696,102, Final Office Action mailed Dec. 22, 2009.
U.S. Appl. No. 11/369,311, Office Action mailed Jan. 5, 2010.
U.S. Appl. No. 11/590,661, Final Office Action mailed Jan. 25, 2010.
U.S. Appl. No. 11/656,661, Office Action mailed Jan. 22, 2010.
U.S. Appl. No. 11/731,581, Office Action mailed Feb. 4, 2010.
U.S. Appl. No. 11/899,683, Office Action mailed Feb. 8, 2010.
Wu, et al., "Methods for Fabricating Zeolite Nano-Crystal Based Low-K Dielectric Films Containing Si (CxHy)n Groups and Treating Films by Ultra-Violet Thermal Processing," Novellus Systems, Inc., U.S. Appl. No. 12/172,089, filed Jul. 11, 2008.
U.S. Appl. No. 11/977,792, Office Action mailed Mar. 9, 2010.
Chaabouni, H. et al., "Porous SiOCH Ultra Low-K recovery treatments after direct CMP process", Advanced Metallization Conference, Sep. 2008.
Chaabouni, H. et al., "Sidewall restoration of porous ultra low-*k* dielectrics for sub-45 nm technology nodes", Microelectronic Engineering 84 (2007).
Huang, H. et al., "O2 Plasma Damage and Dielectric Recoveries to Patterned CDO Low-k Dielectrics", Advanced Metallization Conference, Sep. 2008.
U.S. Appl. No. 11/608,056, Office Action mailed Mar. 23, 2010.
U.S. Appl. No. 11/975,473, Office Action mailed Mar. 25, 2010.
Takagi et al., "High Rate Deposition of a-SiN$_x$:H by VHF PECVD", Mat. Res. Soc. Symp. Proc. vol. 467, 1997, Materials Research Society.
U.S. Appl. No. 12/726,263, "Apparatus for UV damage repair of low K films prior to copper barrier deposition", van Schravendijk et al., filed Mar. 17, 2010.
U.S. Appl. No. 11/811,048, Supplemental Notice of Allowance mailed Oct. 8, 2009.
U.S. Appl. No. 11/115,576, Office Action mailed Apr. 15, 2010.
U.S. Appl. No. 11/519,445, Notice of Allowance mailed Apr. 21, 2010.
U.S. Appl. No. 11/519,445, Allowed Claims.
U.S. Appl. No. 11/561,834, Office Action mailed May 21, 2010.
U.S. Appl. No. 12/646,830, "UV and Reducing Treatment for K Recovery and Surface Clean in Semiconductor Processing", Varadarajan, Bhadri et al., filed Dec. 23, 2009.
U.S. Appl. No. 12/840,192, "Sequential deposition / anneal film densification method", Tarafdar et al., filed Jul. 20, 2010.
U.S. Appl. No. 11/590,661, Notice of Allowance mailed Aug. 6, 2010.
U.S. Appl. No. 11/590,661, Allowed Claims.
U.S. Appl. No. 11/656,661, Final Office Action mailed Aug. 24, 2010.
Li, Shuang et al., "Organic-functionalized pure-silica-zeolite MFI low-*k* films", Chem. Mater. 2005, 17, Mar. 9, 2005, pp. 1851-1854.
U.S. Appl. No. 11/731,581, Final Office Action mailed Sep. 2, 2010.
U.S. Appl. No. 11/115,576, Office Action mailed Oct. 1, 2010.
U.S. Appl. No. 10/972,084, Office Action mailed Oct. 15, 2010.
U.S. Appl. No. 11/977,792, Office Action mailed Oct. 25, 2010.
U.S. Appl. No. 11/975,473, Office Action mailed Nov. 1, 2010.
U.S. Appl. No. 11/608,056, Notice of Allowance mailed Nov. 2, 2010.
U.S. Appl. No. 11/608,056, Allowed Claims.
U.S. Appl. No. 12/566,514, Office Action mailed Jan. 11, 2011.
U.S. Appl. No. 11/561,834, Final Office Action mailed Dec. 3, 2010.

U.S. Appl. No. 11/696,102, Office Action mailed Jan. 26, 2011.
Allowed Claims as of Feb. 24, 2012 for U.S. Appl. No. 11/696,102.
Allowed Claims as of Mar. 2, 2012 for U.S. Appl. No. 11/897,838.
U.S. Appl. No. 11/146,456, Notice of Allowance mailed Nov. 10, 2008.
U.S. Appl. No. 11/146,456, Supplemental Notice of Allowance mailed Dec. 15, 2008.
U.S. Office Action mailed Feb. 22, 2011, from U.S. Appl. No. 12/369,384.
U.S. Appl. No. 11/369,311, Office Action mailed Apr. 13, 2011.
U.S. Appl. No. 12/172,089, Final Office Action mailed Apr. 14, 2011.
U.S. Appl. No. 10/972,084, Office Action mailed May 2, 2011.
U.S. Appl. No. 11/656,661, Office Action mailed May 19, 2011.
U.S. Appl. No. 11/731,581, Office Action mailed Jun. 2, 2011.
U.S. Appl. No. 11/977,792, Office Action mailed Jul. 6, 2011.
U.S. Appl. No. 11/897,838, Office Action mailed Jul. 11, 2011.
U.S. Appl. No. 12/646,830, Office Action mailed Jul. 15, 2011.
Notice of Allowance for U.S. Appl. No. 12/566,514, mailed Jul. 13, 2011.
U.S. Appl. No. 11/696,102, Final Office Action mailed Aug. 11, 2011.
Notice of Allowance for U.S. Appl. No. 12/369,384, mailed Aug. 19, 2011.
U.S. Appl. No. 11/369,311, Final Office Action mailed Sep. 29, 2011.
U.S. Appl. No. 12/973,549, Office Action mailed Oct. 11, 2011.
U.S. Appl. No. 11/977,792, Office Action mailed Oct. 24, 2011.
U.S. Appl. No. 10/972,084, Office Action mailed Oct. 27, 2011.
U.S. Appl. No. 11/656,661, Final Office Action mailed Nov. 10, 2011.
U.S. Appl. No. 12/940,324, Office Action mailed Dec. 13, 2011.
U.S. Appl. No. 11/731,581, Office Action mailed Nov. 28, 2011.
U.S. Appl. No. 11/115,576, Notice of Allowance mailed Nov. 14, 2011.
U.S. Appl. No. 11/602,564, Office Action mailed Feb. 15, 2008.
U.S. Appl. No. 11/602,564, Office Action mailed Sep. 4, 2008.
U.S. Appl. No. 11/602,564, Office Action mailed Mar. 20, 2009.
U.S. Appl. No. 12/001,348, Office Action mailed May 20, 2011.
U.S. Appl. No. 12/001,348, Office Action mailed Nov. 25, 2011.
U.S. Appl. No. 12/001,348, Office Action mailed Mar. 26, 2012.
U.S. Appl. No. 12/008,149, Office Action mailed Mar. 17, 2010.
U.S. Appl. No. 12/008,149, Notice of Allowance mailed Nov. 19, 2010.
U.S. Appl. No. 12/132,559, Office Action mailed Nov. 19, 2010.
U.S. Appl. No. 12/132,559, Final Office Action mailed Jun. 9, 2011.
U.S. Appl. No. 12/132,559, Office Action mailed Nov. 22, 2011.
U.S. Appl. No. 13/275,209, Office Action mailed Mar. 12, 2012.
U.S. Appl. No. 11/369,311, Office Action mailed Mar. 7, 2012.
U.S. Appl. No. 11/696,102, Notice of Allowance mailed Feb. 24, 2012.
U.S. Appl. No. 11/897,838, Notice of Allowance mailed Mar. 2, 2012.
Korean Notification of Provisional Rejection mailed Dated Jul. 12, 2011 for Application No. 10-2010-0066153.
Deshmukh, et al., "Remote Plasma Etching Reactors: Modeling and Experiment," J. Vac. Sci. Technol., B 11(2), Mar./Apr. 1993, pp. 206-215.
Gytri et al., "Methods and Apparatuses for Reducing Porogen Accumulation from a UV-Cure Chamber," Novellus Systems, Inc., U.S. Appl. No. 12/132,559, filed Jun. 3, 2008.
U.S. Office Action mailed Dec. 20, 2005, from U.S. Appl. No. 10/672,311.
U.S. Appl. No. 10/975,028, Notice of Allowance mailed May 8, 2006.
U.S. Appl. No. 10/975,028, Office Action mailed Mar. 24, 2006.
U.S. Appl. No. 10/975,028, Office Action mailed Oct. 6, 2005.
U.S. Appl. No. 11/115,576, "Single-Chamber Sequential Curing of Semiconductor Wafers", Shrinivasan et al., filed Apr. 26, 2005.
U.S. Appl. No. 11/115,576, Office Action mailed May 9, 2011.
U.S. Appl. No. 11/369,311, Office Action mailed Aug. 20, 2009.
U.S. Appl. No. 11/602,564, "Method of Eliminating Small Bin Defects in High Throughput TEOS Films", Henri et al., filed Nov. 20, 2006.

U.S. Appl. No. 11/811,048, Notice of Allowance mailed Aug. 17, 2009.
U.S. Appl. No. 11/975,473, Office Action mailed Oct. 9, 2009.
U.S. Appl. No. 12/132,559, Office Action mailed Mar. 22, 2012.
U.S. Appl. No. 12/172,089, Office Action mailed Sep. 13, 2010.
U.S. Appl. No. 12/210,060, Office Action mailed Nov. 28, 2011.
U.S. Appl. No. 12/646,830, Office Action mailed Jan. 11, 2012.
U.S. Appl. No. 12/840,192, Office Action mailed Feb. 6, 2012.
U.S. Appl. No. 13/070,306, "Measuring in-situ UV intensity in UV cure tool", Eugene Smargiassi, filed Mar. 23, 2011.
Varadarajan et al., "A Cascaded Cure Approach to Fabricate Highly Tensile Silicon Nitride Films," Novellus Systems, Inc., U.S. Appl. No. 13/487,051, filed Jun. 1, 2012.
U.S. Final Office Action dated Aug. 15, 2012 issued in U.S. Appl. No. 13/275,209.
U.S. Office Action dated Jul. 19, 2012 issued in U.S. Appl. No. 11/656,661.
U.S. Final Office Action dated Jul. 19, 2012 issued in U.S. Appl. No. 12/840,192.
U.S. Notice of Allowance dated Sep. 20, 2012 issued in U.S. Appl. No. 12/840,192.
U.S. Final Office Action dated May 1, 2012 issued in U.S. Appl. No. 10/972,084.
U.S. Office Action dated Oct. 5, 2012 issued in U.S. Appl. No. 10/972,084.
U.S. Final Office Action dated Jul. 31, 2012 issued in U.S. Appl. No. 11/369,311.
U.S. Office Action dated Aug. 28, 2012 issued in U.S. Appl. No. 11/731,581.
U.S. Office Action dated May 31, 2012 issued in U.S. Appl. No. 12/726,263.
U.S. Final Office Action dated Sep. 10, 2012 issued in U.S. Appl. No. 12/726,263.
US Office Action, dated Jan. 3, 2013, issued in U.S. Appl. No. 13/487,051.
U.S. Final Office Action dated Oct. 3, 2012 issued in U.S. Appl. No. 12/210,060.
U.S. Final Office Action dated May 25, 2012 issued in U.S. Appl. No. 12/646,830.
US Office Action dated Jun. 7, 2012 issued in U.S. Appl. No. 12/973,549.
U.S. Office Action dated Jan. 3, 2013 issued in U.S. Appl. No. 12/973,549.
Korean Notification of Provisional Rejection dated Mar. 26, 2012 issued in Appl. No. 10-2010-0066153.
SG patent application No. 2010079747 Examination Report mailed Apr. 25, 2012.
PCT International Search Report and Written Opinion dated Dec. 26, 2012, issued in WO Patent Application No. PCT/US2011/064246.
U.S. Appl. No. 13/370,579, filed Feb. 10, 2012, entitled "Single-Chamber Sequential Curing of Semiconductor Wafers."
U.S. Appl. No. 12/001,348, filed Dec. 10, 2007, entitled "Tunable-Illumination Reflector Optics for UV Cure System."
US Office Action, dated Oct. 23, 2012, issued in U.S. Appl. No. 13/370,579.
US Office Action, dated May 31, 2012, issued in U.S. Appl. No. 12/726,263.
US Final Office Action, dated Sep. 10, 2012, issued in U.S. Appl. No. 12/726,263.
US Final Office Action, dated Aug. 15, 2012, issued in U.S. Appl. No. 12/001,348.
US Notice of Allowance, dated Dec. 5, 2012, issued in U.S. Appl. No. 12/001,348.
US Notice of Allowance, dated Jun. 7, 2012, issued in U.S. Appl. No. 13/070,306.
US Final Office Action, dated Jul. 12, 2012, issued in U.S. Appl. No. 12/132,559.
US Notice of Allowance, dated Oct. 25, 2012, issued in U.S. Appl. No. 12/132,559.
Functional Specification, 300 mm UV-cure Module, Novellus Systems, Inc, Doc. No. 74-268253-00, Mar. 6, 2004, pp. 1-25.

* cited by examiner

MULTI-STATION SEQUENTIAL CURING OF DIELECTRIC FILMS

CROSS-REFERENCE TO RELATED APPLICATIONS

This application is a continuation-in-part claiming priority under 35 USC 120 from U.S. patent application Ser. No. 11/369,311, filed on Mar. 6, 2006, titled "Method For Reducing Stress In Porous Dielectric Films," which application is incorporated herein by reference in its entirely for all purposes. U.S. patent application Ser. No. 11/369,311 is a continuation-in-part claiming priority under 35 USC 120 from U.S. patent application Ser. No. 11/115,576, filed on Apr. 26, 2005, titled "Single-Chamber Sequential Curing Of Semiconductor Wafers," which application is incorporated herein by reference in its entirety for all purposes.

FIELD OF THE INVENTION

This invention relates to methods for preparing and treating dielectric films. More specifically, the invention relates to exposing films to ultraviolet radiation and other process conditions to facilitate a desired change in film properties.

BACKGROUND

Many layers of dielectric films are used to make an integrated circuit. IC manufacturing requires dielectric films to have certain properties in order for the circuit to function as designed. For example, there is a general need for materials with low dielectric constants (low-k). Using low-k materials as the intermetal dielectric (i.e., the layer of insulator separating consecutive levels of the conductive metal interconnects) reduces the delay in signal propagation due to capacitive effects, otherwise know as the RC delay. A dielectric material of low dielectric constant will have low capacitance, and hence the RC delay of an IC constructed with such a material will be lower as well.

As another example, there is a general need for materials with specific tensile or compressive stresses. Increasing shallow trench isolation (STI) film tensile stress increases transistor drain current and device performance because the electron and hole mobilities are higher. Other applications require dielectric films to have compressive stress. These and other properties may be met on the film as deposited, or after treatment.

One such treatment may be a thermal process in which the substrate is heated to a temperature for a time. A thermal treatment may remove unwanted particles from the film, or change its stresses. These thermal processes, however, have certain difficulties. In particular, substrate temperatures generally need to be high (i.e., greater than about 400° Celsius) with exposure times typically on the order of hours. As is well known in the field, these conditions can damage copper containing devices, especially in the application wherein a low-k dielectric is being cured. Also, the use of nickel silicide precludes inducing film stress by using temperatures above 400° C. while some SiN films have a cure temperature up to 480° C.

To overcome these disadvantages of thermal processing, another technique has been developed, which involves exposing the film to UV radiation. Irradiation of the low-k or spacer nitride films permits modulation of desired film properties such as dielectric constant or film stress at lower temperatures. However, the use of UV radiation in such processes may result in deleterious side-effects unless special care is taken to deliver the precise wavelengths and to maintain the wafer temperature at an optimal level.

What is needed therefore are improved methods for treating dielectric films with UV radiation to obtain desired film properties.

SUMMARY

The present invention addresses this need by providing improved apparatus and methods of preparing a dielectric material on a substrate. The apparatus involves a multi-station chamber wherein radiation intensity, radiation wavelength, substrate temperature, and gas flow may be independently controlled at each station. Each station may have different optical components selected to filter out or block certain radiation wavelengths, allow certain radiation wavelengths through, or to increase or reduce the intensity of the radiation. In certain embodiments, the apparatus may be a semiconductor processing tool with multiple chambers having one or more stations wherein radiation intensity, radiation wavelength, substrate temperature, and gas flow may be independently controlled at each station.

The methods involve multiple operation ultraviolet curing processes in which radiation intensity, radiation wavelength, wafer substrate temperature and other conditions may be independently modulated in each operation. In certain embodiments, a film containing a structure former and a porogen is exposed to UV radiation in a first operation to facilitate removal of the porogen and create a porous dielectric film. In a second operation, the film is exposed to UV radiation to increase cross-linking within the porous film. In certain embodiments, a film containing silicon nitride is exposed to UV radiation and heat in a first operation to increase tensile stress and wafer temperature. In a second operation, the film is exposed to UV radiation to further increase tensile stress in the film. In certain embodiments, a spin-on ultra low k film is exposed to UV radiation in a first operation to evolve solvents on the film. In a second operation, the film is exposed to UV radiation to increase cross-linking within the film.

BRIEF DESCRIPTION OF THE DRAWINGS

The following detailed description can be more fully understood when considered in conjunction with the drawings in which:

FIGS. 3 A and B are schematic representations of an apparatus suitable for UV porogen removal in accordance with certain embodiments of this invention.

DETAILED DESCRIPTION OF A PREFERRED EMBODIMENT

Introduction

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

The present invention involves a multi-station semiconductor processing chamber. Each station has a wafer support and a radiation source. The radiation source has one or more light generators and one or more optical components. The radiation intensity and the wavelength output of the radiation source may be independently controlled at each station. The wafer support temperature and gas flow may also be independently controlled at each station. In certain embodiments, the present invention pertains to a multi-chamber semiconductor processing tool having at least one wafer processing station in each chamber and capable of independently control radiation intensity, radiation wavelengths, and wafer temperature at each station.

The present invention also involves processes to prepare and/or cure dielectric films on substrates by exposure to UV radiation. Effects of exposure to UV radiation or UV curing may include increased stress of the materials, increased cross-linking of the bonds of the material and densification the material. UV radiation is also used to remove porogen from a precursor layer containing a porogen and structure former or backbone, thereby forming a porous dielectric film. UV radiation can also be used to evolve solvents present in a film, such as a spin-on ULK film. It is often desirable to modulate one or more of these effects in preference to one another—for example, for dense low-k carbon-doped oxide (CDO) films, it is desirable to increase the mechanical properties of the films by cross-linking without a large increase in the stress of the film whereas for silicon nitride films, a large increase in the stress may be desirable. Similarly, in preparing porous low-k films from precursor layers, it may be desirable to remove porogen from a precursor layer and strengthen the backbone without causing the film thickness to shrink, and thereby causing a concomitant increase in stress. Further, in the case of porous low-k films, it may be desirable to remove the porogen from the film before its cross-linking commences.

Conventional UV curing processes use a single processing condition, e.g. 100% UV intensity and temperature of 400° C., that may be suitable for one or some of the effects listed above but may also cause an undesired effect. For example, porogen evolution and film strengthening occur at slightly different wavelengths. Using a broad spectrum UV radiation, Si—$CH_3$ bonds in the film would cross-link rapidly. As a consequence of this cross-linking the film shrinks and rapidly densifies, trapping porogen in the matrix and preventing its successful evolution. This undesired effect causes the film to have a higher dielectric constant than desired.

Methods of the invention modulate these effects in preference to one another. In certain embodiments, the methods involve multiple operation cure processes, each operation having a particular desired result or effect, with conditions such as UV intensity and substrate temperature optimized for the particular desired result. Also in certain embodiments, optimizing conditions for a desired effect involves independently controlling the UV intensity, UV wavelength range, and the substrate temperature in each operation (i.e., so that the substrate temperature is decoupled from the UV intensity and wavelength). The methods of the invention may be performed in multi-station cure chambers, each station having a UV light source, and conditions at each station optimized for the desired result at that station.

UV curing is used to drive out porogen from composite porogen-CDO films, leaving a porous CDO matrix with a low k-value, generally between 2.0 and 2.6. In a particular embodiment, the methods of the present invention are used to prepare dielectric films from precursor films or layers that contain a structure former that serves as a backbone of a porous network, and a porogen, which generates the porous regions within the porous network. The methods involve a multiple operation UV cure process in which porogen is removed in an initial exposure (or exposures) to UV radiation to form a porous dielectric film. This operation tends to make the film softer. Once the porogen is removed, the film is exposed to UV radiation to increase cross-linking within the film, thereby increasing the hardness. Films produced by these methods have lower stress than films produced using a single cure operation, while having comparable hardness and modulus as those films. The UV exposure characteristics of these operations are different so as to accomplish different effects on the film.

Figure 1:
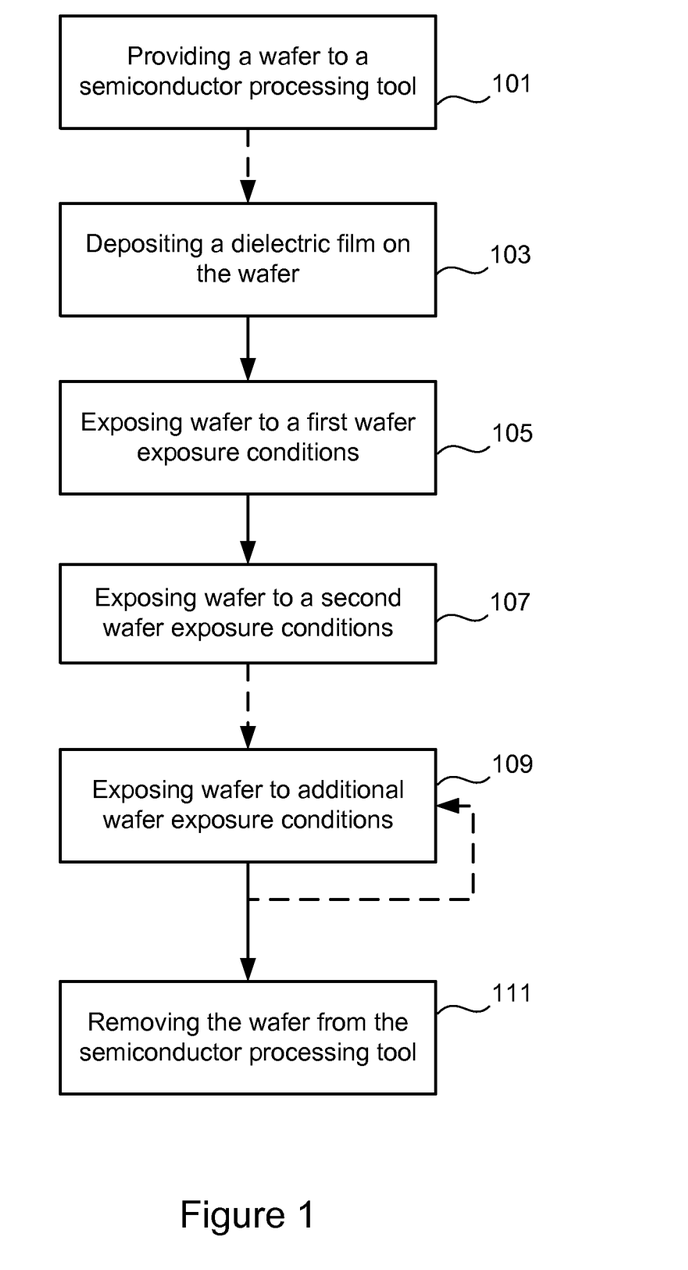
FIG. 1 is a flowchart summarizing stages of a general process in accordance with the present invention.

FIG. 1 is a flow chart depicting generic operations in accordance with the present invention. Initially, a wafer is provided to a semiconductor processing tool 101. This wafer may or may not have a film deposited on it that will be the subject of the UV treatment. If the wafer does not include the film to be treated, an optional step would be to deposit such film onto the wafer 103. This deposition may be performed in a separate chamber or in a first station of a multi-station chamber. Based on the type of film to be treated and processing to be achieved, the wafer is then exposed to radiation under a first set of exposure conditions 105. These conditions may be radiation intensity, radiation wavelength(s) (either a single wavelength may be used or a spectrum or a range of wavelengths), wafer temperature, and gas flow. These conditions may be controlled independently from each other from operation to operation. In a second operation, the wafer is exposed to radiation at a second set of conditions 107. Typically one or more of these conditions will be different from operation to operation, and additional operations may be used to vary one or more of these conditions 109. An operation may include transferring the wafer between stations, so that the same operation is performed at more than one station, but under the same conditions.

An operation covering more than one station may be preferable in some cases to average out any radiation non-uniformity. Because the wafer is flat and circular, a light generator, usually tubular, cannot uniformity irradiate all parts of the wafer. Using optical components, a plurality of light generators, and carefully designing the layout of these generators, the radiation across the wafer can be made more uniform, but not perfectly. By exposing wafers in subsequent stations under the same exposure conditions but in a different relative orientation (between the light source and the wafer), any spots of non-uniformity are changed from station to station. The generators may be laid out and relative orientation changed such that the total exposure from all of the light sources in the various stations is uniform over the wafer. After the irradiation operations, the wafer is removed from the semiconductor tool 111. However, the wafer may experience more processing before it is removed, for example, the wafer may be cooled, or more films may be deposited, before the wafer exits the semiconductor processing tool.

In certain embodiments, the UV cure processes described herein improve wafer throughput by reducing UV exposure time and/or parallel processing of wafers. For example, in one embodiment, having a dedicated porogen removal step reduces required UV exposure time to harden the film by 75% resulting in a three-fold improvement in wafer throughput in the UV cure station.

Reference is made throughout the specification to multiple operations in which porogen is removed from a precursor film in an initial operation or operations, and cross-linking (and hardness) is increased in a subsequent operation or operations and for which temperature and UV intensity differentiate the porogen removal and cross-linking operations. As indicated, these processes may be used to produce low stress porous dielectric films having good mechanical strength. However, the multiple operations may also be used for other UV curing processes in which exposure conditions differ from stage to stage to increase any of the effects of UV radiation in preference to any other effect. Some of these UV curing processes include increasing the tensile stress in nitride film at different wafer temperatures and treatment spin-on ULK film to evolve solvent and to harden the film.

Forming the Precursor Film

Certain embodiments of the present invention involve depositing onto a wafer the film to be irradiated. Different types of film may be deposited, depending on process requirements. One such film is the low-k dielectric film. A precursor film or layer that contains a "structure former", typically a dielectric material, is deposited with a porogen, which generates the porous regions within the dielectric material. In a method of this invention, the porogen is removed from the precursor film to create a porous low-k dielectric layer. Within the precursor film, the porogen resides in locations that will subsequently become void locations in the final dielectric film.

The precursor film may be formed by any of numerous techniques. In some methods, the structure former and porogen are co-deposited in one process. Any suitable deposition technique may be used, including spin-coating processes, print-on, dip coating, thermal process and chemical vapor deposition—particularly plasma enhanced chemical vapor deposition (PECVD). In alternative methods, the structure former and porogen are deposited separately in a two-phase process. For example, in some mesoporous films, a template-forming precursor, solvent and catalyst are mixed and applied by spin-coat or print-on methods to form a template in a first process phase, then a silica-forming precursor is introduced to the formed template in a second process step such as supercritical infusion into a polymer matrix. Depending on the application, the thickness of the precursor film may range between about 15 nanometers and 3 micrometers.

Generally, a porogen is any removable material that defines void regions in a dielectric matrix. Frequently, though not necessarily, the porogen is an organic material. In methods of the present invention, the porogen is removed from the precursor film by a UV mediated method. In a first approach, the UV light directly interacts with the porogen to chemically decompose or otherwise modify the porogen and produce products that are more easily removed than the porogen itself. In another approach, the UV exposure occurs in the presence of oxygen to create an oxidizing environment (e.g., ozone and/or oxygen radicals) that oxidizes the porogen. The oxidation products are more easily removed than the porogen itself. Note that in this approach, some UV radiation may interact directly with the porogen as well. In general, the UV radiation is tuned for absorption by the porogen in the first approach and tuned for oxygen activation in the second approach. Thus, in the first approach, the UV radiation preferably has a high intensity component at a wavelength (or range of wavelengths) at or near an absorption peak of the porogen. Of course, the porogen may be chosen to match the characteristics of an available UV source.

In some cases the porogen is randomly distributed throughout the precursor film and other cases it is ordered in a repeating structure throughout the film. In the case of an ordered porous or mesoporous dielectric matrix, the porogen is frequently referred to as a "template." One type of ordered porogen, for example, is a block copolymer that has chemically distinct components (e.g. PEO polyethylene oxide and PPO polypropylene oxide) that segregate into separate phases. The discussion herein will refer to porogen and porogen materials in general and are intended to include any type of porogen, ordered or non-ordered, organic or inorganic, unless otherwise specified.

Frequently, the porogen is a hydrocarbon. The following is a non-comprehensive list of precursor films (listed by type of porogen molecules) suitable for the present invention. "Low temperature porogens" are deposited below about 200 degrees C. and "high temperature porogens" are deposited above about 200 degrees C.

| Low Temperature Porogens | High Temperature Porogens |
|---|---|
| Aldehydes: CH2O, CH3CHO | Alkenes: C2H4, CH3—CH=CH2, etc |
| Alkenes: C2H4, CH3—CH=CH2, etc | Terpene family compounds (e.g. alpha-terpinene) |
| di-tert-butyl silane | Terpene derivatives (such as terpinol) |
| Esters | Compounds with multiple active sites (e.g., ENB) |

One preferred class of porogens is the polyfunctional cyclic non-aromatic compounds, particularly alpha-terpinenes (ATRP). Suitable alpha-terpinene derivatives include, for example, alpha-terpinene itself, substituted alpha-terpinenes, and multi-ring compounds containing the alpha-terpinene nucleus. Other compounds include functional groups such as —CH=CH$_2$, —CH=CH—, —C≡CH, —C≡C—, —C=O, —OCH$_3$. A typical example of these compounds is 1,2,3,4-tetramethyl-1,3-cyclopentadiene (TMCP) (C$_9$H$_{14}$). Three-dimensional multi-ring compounds such as 5-ethylidene-2-norbornene (ENB) are also suitable. Another ATRP compound that is preferred is D-limonene.

In some cases, the porogen and structure former reside in the same compound. That is, the porogen is a removable moiety in a compound that contains moieties serving as structure formers covalently bonded to moieties serving as the porogen. Nominally, the porogen moiety is a large bulky organic substituent that will leave pores in the resulting dielectric film. Examples of such species are organic silanes such as di-tert-butylsilane, phenyldimethylsilane, and alkoxysilanes such as 5-(bicycloheptenyl)methyldimethoxysilane (BMDS) and 5-(bicycloheptenyl)triethoxysilane (BTS) (SIC$_{13}$O$_3$H$_{24}$). These compounds may be deposited using CVD or spin on methods, for example.

As indicated, the structure former serves as a backbone for the resulting porous low-k film. Many different chemical compositions may be used as the structure former. In some embodiments, the composition includes silicon and oxygen. Sometimes it also includes carbon and/or other elements and even metals. For relatively thick precursor layers, it will sometimes be desirable to use structure formers that are not opaque to the UV radiation.

Examples of precursors for structure formers include silanes, alkylsilanes (e.g., trimethylsilane and tetramethylsilane), alkoxysilanes (e.g., methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes and cyclic siloxanes (e.g. octamethylcyclotetrasiloxane (OMCTS) and tetramethylcyclotetrasiloxane (TMCTS)). Note that one example of a silane is di-tert-butylsilane, described above.

The thickness of the precursor film (and hence the resulting dielectric layer) depends upon the ultimate application. For an interlayer dielectric or packaging application, the thickness may range from 100 angstroms up to about 2 to 3 microns. In some cases, extra thickness is required to provide some amount of sacrificial dielectric to accommodate a subsequent planarization operation. In some cases, the thickness of the precursor layer may be driven in part by the ability of the UV radiation to penetrate the film and remove the porogen. Therefore relatively thinner precursor layers may be required for some processes.

In certain embodiments, a silicon nitride (SiN) film may be deposited. Silicon nitride may be used in place of silicon dioxide for top layer protection because it is harder and has better hermeticity, etch selectivity, and protects regions below it against oxidation. Silicon nitride films may be deposited with a LPCVD (low-pressure chemical vapor deposition) or a PECVD (plasma-enhanced chemical vapor deposition) process. The process to deposit silicon nitride is well known in the art. UV radiation may be used to change the stress properties of the silicon nitride film, generally to increase its tensile stress. In some cases, the film deposition and the UV treatment may occur in the same semiconductor processing tool.

In certain embodiments, a spin-on film may be deposited onto the wafer. As its name states, the spin-on ULK film is applied to the wafer via a spinning process. First a liquid solution containing the film is applied to the wafer, and the wafer is spun to evenly spread the liquid solution to all parts of the wafer. After the film is applied to the wafer, it is cured to drive-off the solvent; complete chemical reactions; drive off unreacted monomers and oligomers; and to densify the film. Because the spin-on process requires a coater, a special equipment not yet integrated with UV radiation apparatus, the deposition and the UV treatment usually do not occur in the same semiconductor processing tool.

In some embodiments the ULK film may be applied to the wafer using a print-on method. Here a collection of nozzles, preferably actuated using sonic energy, is used to disperse the film-containing precursor solution on the wafer surface. The nozzles are scanned across the wafer to produce a uniform film over its surface. Subsequent curing is used in the same manner as that for spin-on films. The curing process may include a heating step to drive away most of the solvent from the precursor film. Subsequent UV treatment may be used to better penetrate the film to drive away residual solvent, and unreacted monomers & oligomers. Finally, the UV treatment causes film hardening through cross-linking. In this embodiment, the sequential multi-station approach may use IR lamps for the first step, i.e., wherein bulk solvent removal is required. Subsequent steps leading up to film strengthening may then use UV radiation sources.

Porogen Removal

The porogen removal operation may be accomplished by thermal anneal, UV radiation, or a combination of both. It will be appreciated by those skilled in the art that the UV radiation used with the invention encompasses near-UV, as well UV wavelengths. Thus, the radiation used to facilitate porogen removal in accordance with this invention may have wavelengths ranging between about 156 and 500 nanometers. As indicated, the UV wavelength(s) should match the absorption characteristics of the porogen bonds to be broken and/or the oxidizing agent, if used. Common bonds to be targeted which contribute to the overall absorption characteristics of the porogen-containing film are Si—$CH_3$, C—C, C=C and C—H. For example, ATRP has an absorption peak at approximately 250-270 nanometers; therefore, a UV source intended to interact directly with a film containing ATRP preferably has high intensity components in the range of about 220 to 285 nanometers. Note that the radiation may comprise a narrow range of wavelengths (e.g., most intensity exits in a band about 1 to 20 nanometers in width) or a broader range of wavelengths.

As indicated, the UV light can directly interact with porogen bonds and thereby facilitate its decomposition or other breakdown mechanism. In a typical case, the porogen decomposes into lower molecular weight components that exist in the vapor phase or can be easily vaporized and thereby removed from the precursor film. Alternatively the UV radiation can indirectly facilitate breakdown of the porogen. In one example, this is accomplished by the UV radiation interacting with a compound other than the porogen to convert that compound into a species that can attack the porogen and thereby facilitate its removal. For example, the UV radiation may convert molecular oxygen or other oxygen containing compounds present in a reaction chamber to produce a strong oxidant, which can then react with and break down the porogen. Again, the decomposition products of the porogen can be volatilized and removed from the precursor film.

In embodiments wherein UV radiation is used to remove porogen, one or more of substrate temperature, UV intensity and UV wavelength are set to result in porogen removal while minimizing the increase in the stress of the film. As discussed above, the single conventional cure operation, e.g., at 400° C. and 100% UV intensity, used for porogen removal and increasing hardness results in an increase in stress. In certain embodiments of this invention, the porogen removal operation is performed at a lower UV intensity and/or lower temperature than subsequent cross-linking operations.

Temperatures during the porogen removal operation may be from around 250° C.-450° C. As indicated, in some embodiments the temperature during the porogen removal operation is lower than the temperature during the cross-linking operation. For example, the temperature during the porogen removal operation may range from about 250° C.-375° C.; in specific embodiments the temperature ranges from about 300° C.-350° C., about 300° C.-325° C., and about 350° C.-375° C. In one particular embodiment, the temperature is about 375° C. during the porogen removal operation. As discussed below, temperatures during the cross-linking operation may be around 400° C. or greater.

Also in certain embodiments, UV intensity is lower than during the cross-linking operation. For example, UV intensity may be from about 0-60%, 0-70%, 0-80% or 0-90% than it is during the cross-linking operation. In a specific embodiment, UV intensity is about 50-90% of the intensity during the cross-linking operation.

In some embodiments, the porogen removal operation may be accomplished by a thermal anneal (i.e., with zero UV intensity). Temperatures required for purely thermal anneal depend on the particular porogen used. Typical temperatures range from around 300° C.-450° C., e.g., around 400° C. The use of a thermal cure alone to remove porogen may be beneficial to reduce the total time of UV exposure.

In certain embodiments, both substrate temperature and UV intensity are lower during the porogen removal operation than for subsequent cross-linking operations. Unlike in a conventional single operation UV cure process, conditions during the porogen removal operation are such that the film is typically made softer or more compliant as a result of this operation. In certain embodiments, the UV intensity is the same or higher during the porogen removal process as during subsequent cross-linking operations. For example, in some embodiments, temperature but not UV intensity may be constant during porogen removal and cross-linking operations. In other embodiments, UV intensity may be constant (e.g., at 100%) for porogen removal and cross-linking operations, with temperature lower during the porogen removal operation.

Figure 2:
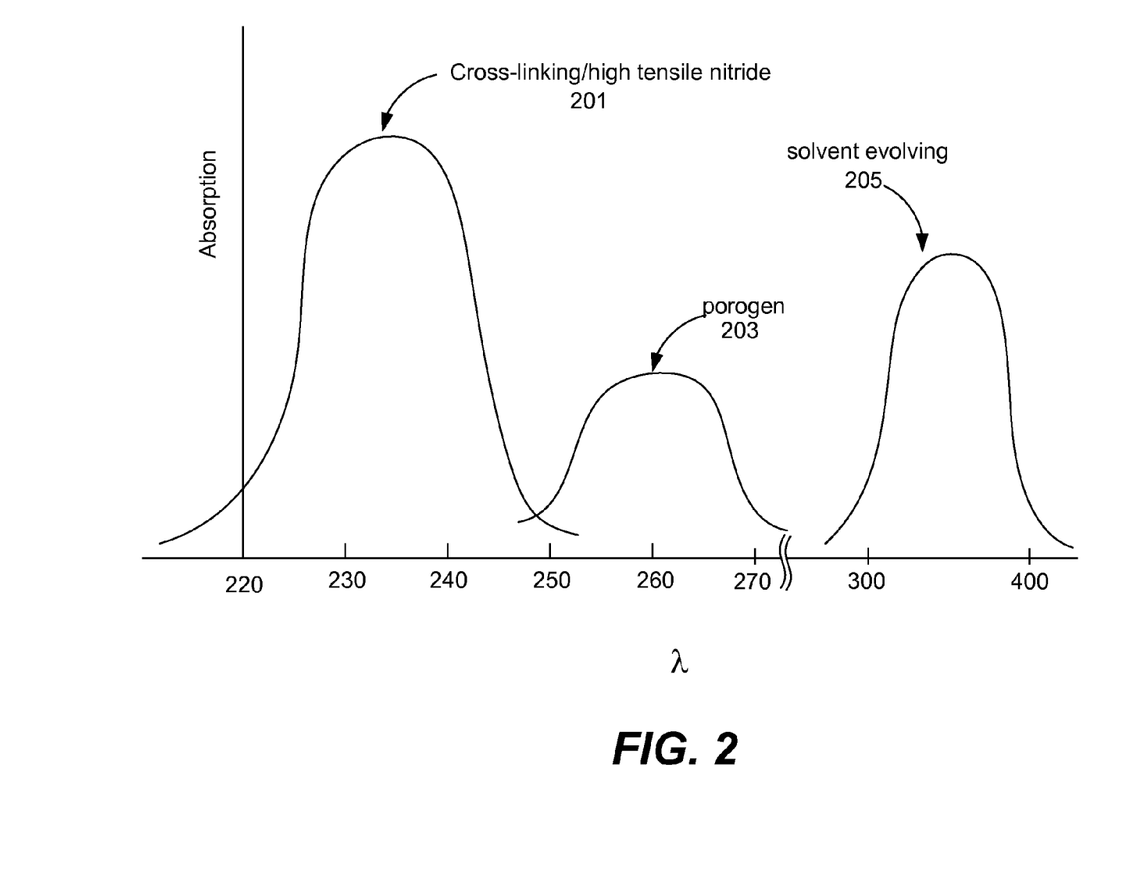
FIG. 2 is a rough schematic representing UV absorption as a function of wavelength for certain processes in accordance with the present invention.

In certain embodiments, conditions during the porogen removal operation and the cross-linking operation or operations are also differentiated by the wavelength of the UV radiation. FIG. 2 shows a rough schematic of UV absorption as a function of wavelength for a porogen and cross-linking in a dielectric material. As can be seen from the figure, absorption of radiation by the backbone is highest shorter wavelengths, including wavelengths about 220-250 nm, and decreases around higher wavelengths. Absorption of radiation by the porogen is dependent on the particular porogen used; the porogen shown in FIG. 2 has an absorption peak around 260 nm. It should be noted that the absorption spectra depicted are examples; the absorption spectra of the porogen and backbone depends on the particular compositions. In certain embodiments, a first station of a multi-station cure chamber has a radiation source emitting radiation of wavelengths of common porogens, e.g., around 200 nm-500 nm, 200 nm-280 nm, or around 250 nm, while other stations dedicated to increasing the mechanical strength of the porogen have radiation sources that emit lower wavelength radiation.

UV exposure time is largely a function of both the lamp intensity and the density and thickness of the precursor layer including porogen and structure former. UV exposure times range from seconds to tens of hours. Preferably, for commercial applications, the exposure time will be about 5 minutes or less. In a preferred embodiment, the exposure time ranges from about 1 second up to 5 minutes. Purely thermal porogen removal operations may take longer, e.g., hours to tens of hours.

As indicated the UV radiation may directly interact with the porogen or it may generate a reactive species that in turn attacks the porogen. If the exclusive mechanism is direct interaction, then the porogen removal operation is preferably performed an inert environment. This may be a vacuum, a noble gas atmosphere (e.g., argon or helium), or a nitrogen atmosphere, etc. In some embodiments, a quantity of hydrogen gas may be used as well. If reactive species are to be generated, then the atmosphere could include oxygen, $N_2O$, $CO_2$, $NO_2$ or a combination thereof. When exposed to UV radiation, molecular diatomic oxygen forms less stable but more aggressive oxidizing species such as ozone and oxygen radicals. The ozone and oxygen radicals are sufficiently strong oxidizing agents to oxidize the organic porogen. The porogen is then removed in the form of small volatile hydrocarbon molecules and oxygen containing species.

If not removed quickly the volatile porogen removed from the substrate may adhere to the chamber walls or windows. The porogen may become a source of contamination for other substrates or cloud the windows and reduce the effectiveness of the UV radiation. U.S. patent application Ser. No. 11/391, 134, filed March 2006 and titled PURGING OF POROGEN FROM UV CURE CHAMBER, describes mechanisms to ensure that the porogen is removed quickly, and is hereby incorporated by reference in its entirely, for all purposes. UV-mediated porogen removal is also discussed in commonly assigned U.S. patent application Ser. No. 10/672,311, filed Sep. 26, 2003 and titled METHOD OF POROGEN REMOVAL FROM POROUS LOW-K FILMS USING UV RADIATION, which is hereby incorporated by reference in its entirety, for all purposes.

Cross-Linking

As noted above, after the porogen removal operation, the film is typically soft and compliant. The cross-linking operation increases the hardness and/or modulus of the film. The cross-linking operation is so called because it is believed that it increases the number of crosslinks (i.e., the number of covalent bonds) within the dielectric film, thereby increasing the film hardness. However, the invention is not limited to a particular mechanism of increasing the hardness and modulus. Hardness and modulus are well defined within the art and will not be discussed in detail herein. Measures of film hardness and modulus presented herein may be made with any suitable apparatus including nano-indenter device.

One way to characterize mechanical performance of a dielectric film is via a "cracking threshold" measurement. This is a measure of thickness of a dielectric film on a blank substrate (e.g., a flat 300 mm wafer) that can be deposited without forming a crack. In a typical experiment, the dielectric is deposited to various thicknesses using a single set of process conditions. The resulting wafer (with dielectric film) is set aside without disturbance for a period of time (e.g., one day) and then examined for cracks. The greatest thickness at which no crack is observed is the cracking threshold. For many processes, the cracking threshold is measured in micrometers. The cracking threshold as well as crack propagation velocity in dielectric films is exponentially dependent on film stress. Thus it is important to minimize thin film stresses to prevent crack propagation through the dielectric layer during the packaging process. As indicated above, in certain embodiments, multi-operation porogen removal and curing operations of the present invention result in minimizing the stress of the film.

The cross-linking operation is performed by exposing the porous dielectric film to radiation. In certain embodiments, the film is exposed to ultraviolet radiation. However, as noted above, radiation having wavelengths as low as 150 nanometers may be used to increase cross-linking.

Substrate temperatures may range from around room temperature to about 450° C., for example around 400° C. As indicated, in certain embodiments, substrate temperatures during the cross-linking operation are typically higher than during porogen removal. In a particular embodiment, substrate temperature during porogen removal is about 375° C., and during the cross-linking operation around 400° C. In some embodiments, substrate temperature during the cross-linking operation or operations may be as high as the thermal budget allows.

UV intensity may also be higher during cross-linking than during porogen removal, as discussed above. UV exposure time is largely a function of both the lamp intensity and the density of the precursor layer including porogen and structure former. UV exposure times range from seconds to tens of hours. Preferably, for commercial applications, the exposure time will be about 5 minutes or less. In a preferred embodiment, the exposure time ranges from about 1 second up to 5 minutes.

The UV radiation during the cross-linking operation may be modulated, e.g., by intensity, to facilitate mechanical strengthening. This is described in the commonly assigned U.S. patent application Ser. No. 10/825,888, filed Apr. 16, 2004 and titled "Method To Improve Mechanical Strength Of Low-K Dielectric Film Using Modulated UV Exposure," which is hereby incorporated by reference in its entirety.

Increasing Tensile Stress in Silicon Nitride Film

A silicon nitride film may be treated to increase tensile stress in accordance with the present invention. For certain applications, silicon nitride may be used in place of silicon dioxide for top layer protection because it is harder and has better hermeticity, etch selectivity, and protects regions below it against oxidation. Silicon nitride films may be deposited with an LPCVD (low-pressure chemical vapor deposition) or a PECVD (plasma-enhanced chemical vapor deposition) process.

UV radiation may be used to change the stress properties of the silicon nitride film, generally to increase its tensile stress. Tensile nitride films are used to create and transfer strain to the source and drain regions of NMOS devices. This strain is transferred to the channel regions of the NMOS devices and improves the mobility of carriers, and thus performance of the transistor in an integrated circuit.

UV radiation is known to increase silicon nitride film tensile stress. It is believed that UV radiation breaks Si—H and Si—OH bonds in a PECVD or LPCVD nitride film and allows the hydrogen and resulting water vapor to diffuse out of the film. The presence of bonded hydrogen in the film reduces the nominal spacing between the molecules and generates compressive stress. When the hydrogen is removed, the spacing between the molecules is increased and the film becomes more tensile.

The degree of change in tensile stress can be controlled. Factors include the thickness of the silicon nitride film, the power and intensity of the UV radiation, the duration of exposure, and the temperature of the wafer. By modulating these parameters, the change in tensile stress can be controlled. Of course, some purge gas is flowed to remove the hydrogen and water vapor removed from the film.

In some embodiments, the UV treatment of silicon nitride has two operations: an initial bond breaking operation; and a bond breaking and diffusion operation. It is known in the art that a partially fabricated semiconductor wafer may be subjected to high temperature for a limited time. Every time a wafer is heated to a high temperature, the doped regions in the wafer may spread and regions of mismatched coefficients of thermal expansion may cause extrusions or even delaminations between layers. Every time a wafer is heated and cooled, between 400° C. and room temperature, more crystal dislocation forms, which may cause device failure. On the other hand, diffusion of hydrogen and water vapor through a film is correlated to wafer temperature. In order to minimize the duration of higher temperature exposure, the initial bond breaking operation occurs with a lower wafer temperature. As more hydrogen and hydroxyls are freed, the wafer temperature is increased in the second operation to facilitate removal of the hydrogen and water vapor from the film. The use of two operations to increase the tensile stress of silicon nitride films minimizes the duration of high wafer temperature and maximizes the bond-breaking effects of the UV radiation. In some cases, the wafer temperature may be as high as 480° C. during the higher temperature diffusion operation.

Spin-On Films

A spin-on ULK film may be treated with UV radiation first to evolve the solvent and then to harden and strengthen the film. As its name states, the spin-on ULK film is applied to the wafer via a spinning coating process. First a high viscosity liquid precursor containing the film is applied to the wafer while the wafer is spinning to evenly spread the liquid solution to all parts of the wafer. The spin-on process was first used to apply a thin layer of photoresist. This simple process can planarize the surface of the wafer, because the liquid precursor can form a thin film covering all features.

After the substrate is coated with the liquid precursor, it must undergo annealing to drive-off the solvent; complete chemical reactions; drive off unreacted monomers and oligomers; and to densify the film. Depending on the precursor, different solvents may be used. Generally, two or three operations of bake and cure are used. An initial operation at a lower temperature is generally used to drive off the solvent and to complete chemical reactions and a second operation at a higher temperature is generally used to drive off unreacted materials and to densify the film.

UV radiation can be used instead of the thermal annealing process to complete the spin-on film deposition. In accordance with the present invention, two or three operations can be performed in one semiconductor processing tool. Just like the thermal annealing process, the solvents are first evolved from the spin-on film while the chemical reactions complete. Liquid precursor solvents tend to be volatile and easily evolved; therefore, a lower wafer temperature and less UV intensity is required. However, the purge gas flow rate must be high to remove all evolved solvent and keep the reactor clean. The UV parameters must favor solvent evolution so as not to cause premature hardening and strengthening of the film and trap solvent particles in the dielectric film. The UV wavelengths may be tuned to target the specific solvent. Longer wavelengths may be used to effectively volatilize the solvent without rearranging the chemical bonds within the film. Managing the relative rates at which solvent in a film is evolved and that at which the film hardens is important for the complete removal of solvent.

The next UV operation would be to drive off unreacted organic materials. This step is very similar to the operations for porous ULK films. In this operation, the UV intensity and wafer temperature are increased to that for cross-linking. The UV wavelengths are also changed to the spectral band that favors cross-linking. The purge gas flow rate is still high, to remove any unreacted organic materials. After this operation, the remaining operation is the same as that for cross-linking of a porous ULK film, which is discussed above.

Apparatus

The present invention can be implemented in many different types of apparatus. Generally, the apparatus will include one or more chambers (sometimes referred to as process reactors) that house one or more wafers and are suitable for wafer processing. At least one chamber will include a UV source. A single chamber may be employed for all operations of the invention or separate chambers may be used. Each chamber may house one or more wafers for processing. The one or more chambers maintain the wafer in a defined position or positions (with or without motion within that position, e.g., rotation, vibration, or other agitation) during UV treatment operations. For certain operations in which the wafer is to be heated, the apparatus may include a heating platen.

In certain embodiments the multi-operation cure process is performed using a multi-station cure chamber. As discussed above, in certain embodiments, the multiple operation cure processes of the invention rely on being able to independently modulate the UV intensity, wavelength, spectral distribution and substrate temperature of each step or operation. Additionally, certain inert or reactive gases may be injected during the cure process at the same or different flowrates at each step. For example, in one embodiment, the porogen removal operation uses the same UV intensity but a lower substrate temperature than the cross-linking operation. In another embodiment, the porogen removal operation uses a lower substrate temperature and a lower UV intensity than the cross-linking operation. Similarly, various effects of UV exposure (porogen removal, change in stress, change in hardness, process time, etc.) may be modulated by independently modulating UV intensity and substrate temperature. Detail process parameters of various examples are discussed below.

Multi-station cure chambers capable of modulating these effects by providing independent control of the substrate temperature and the UV intensity are described in above-referenced U.S. patent application Ser. No. 11/115,576 and in commonly assigned U.S. patent application Ser. No. 11/184,101, filed Jul. 18, 2005, titled "Cast Pedestal With Heating Element and Coaxial Heat Exchanger," which is hereby incorporated by reference in its entirety and for all purposes.

These chambers decouple substrate temperature and UV intensity by reducing the amount of IR radiation on the wafer and/or providing independent heat transfer mechanisms to and from the wafer. For example, the chambers may be equipped with cold mirrors or other reflectors to reduce the amount of IR radiation incident on the wafer. In addition, each pedestal or other substrate support may have an independent heat transfer mechanism to help maintain a substrate temperature regardless of the UV intensity. Thus, unlike conventional UV cure chambers where substrate temperature is coupled to UV intensity, the substrate temperature and UV intensity may be independently set for a wide range of temperatures and intensities.

Figure 3A:
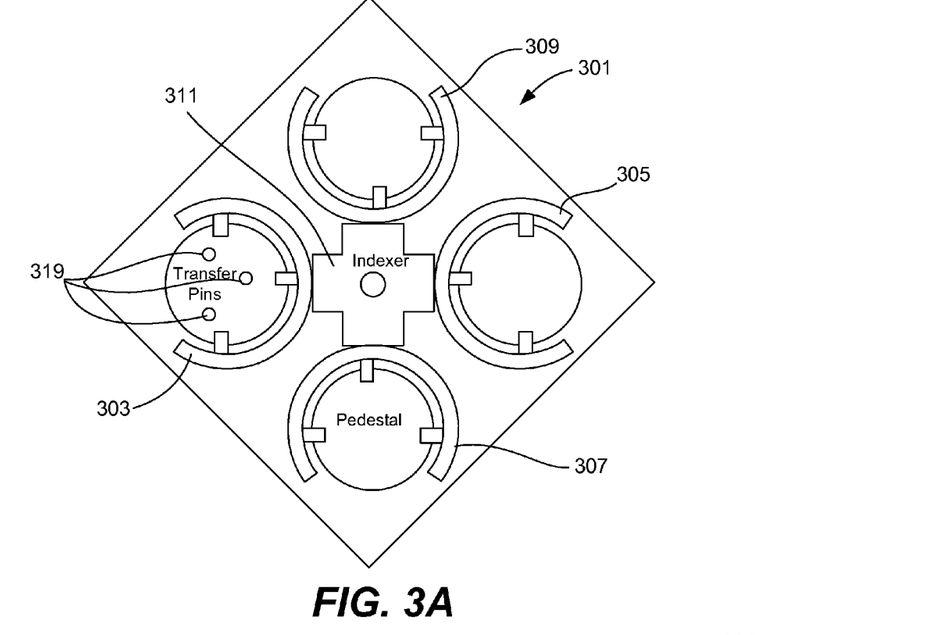
Figure 3B:
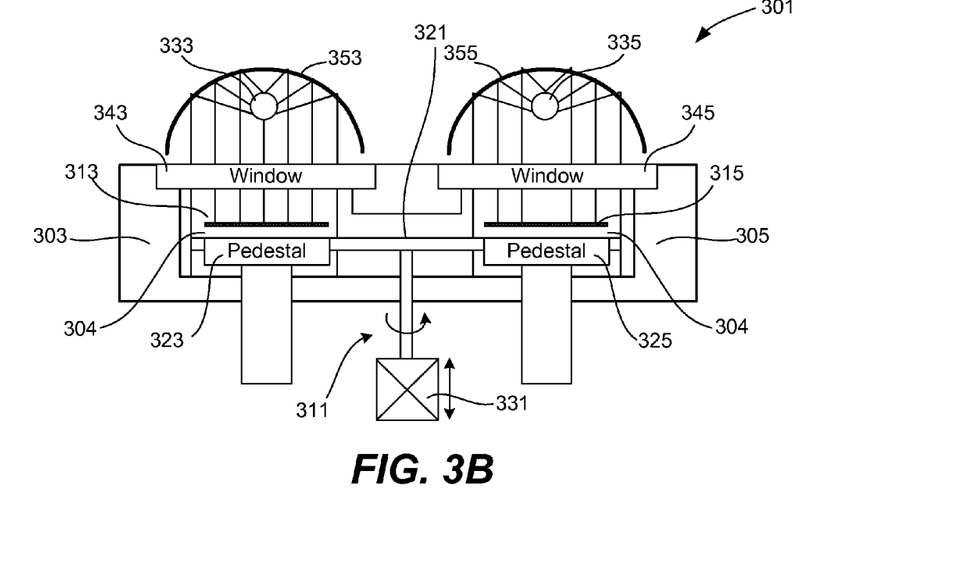

FIGS. 3A and 3B show one embodiment of an apparatus appropriate for use with certain embodiments of the invention that uses UV flood lamps. Chamber 301 includes multiple cure stations 303, 305, 307 and 309, each of which accommodates a wafer. Station 303 includes transfer pins 319. FIG. 3B is a side view of the chamber showing stations 303 and 305 and wafers 313 and 315 located above pedestals 323 and 325. There are gaps 304 between the wafers and the pedestals. The wafer may be supported above the pedestal by an attachment, such as a pin, or floated on gas. Parabolic or planar cold mirrors 353 and 355 are located above UV flood lamp sets 333 and 335. UV light from lamp sets 333 and 335 passes through windows 343 and 345. Wafers 303 and 305 are then exposed to the radiation. In alternative embodiments, the wafer may be supported by the pedestals 323 and 325. In such embodiments, the lamps may or may not be equipped with cold mirrors. By making full contact with the pedestal, the wafer temperature may be maintained by use of a conductive gas such as helium or a mixture of helium and argon at a sufficiently high pressure, typically between 50 and 760 Torr, but preferably between 100 and 600 Torr.

In operation, a wafer (or other substrate) enters the chamber at station 303 where the porogen removal operation is performed. Pedestal temperature at station 303 is set to a first temperature, e.g. 375° C., with the UV lamps above station 303 set to a first intensity, e.g., 70% maximum intensity. After having some or all of the porogen removed in station 303, the porous dielectric matrix is soft and is transferred to station 305 for hardening. Pedestal temperature at station 305 is set to a second temperature, e.g., 400° C. and UV intensity is set to a second intensity, e.g. 100%, or maximum, intensity. Stations 307 and 309 may also be used for increasing hardness. For example, conditions at stations 305, 307 and 309 may be the same. Each wafer is sequentially exposed to each UV light source In some cases, different stations irradiate the wafer at different wavelengths or wavelengths ranges. The example above uses a UV flood lamp, which generates radiation in a broad spectrum. Optical components may be used in the radiation source to modulate the part of the broad spectrum that reaches the wafer. For example, reflectors, filters, or combination of both reflectors and filters may be used to subtract a part of the spectrum from the radiation. One such filter is a bandpass filter.

Figure 4:
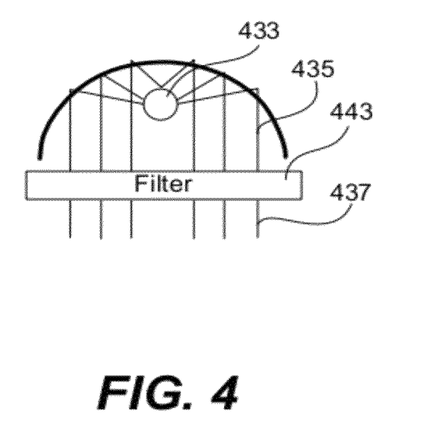
FIG. 4 is a schematic representation of a UV source and filter.

Optical bandpass filters are designed to transmit a specific waveband. They are composed of many thin layers of dielectric materials, which have differing refractive indices to produce constructive and destructive interference in the transmitted light. In this way optical bandpass filters can be designed to transmit a specific waveband only. The range limitations are usually dependant upon the interference filters lens, and the composition of the thin-film filter material. Incident light is passed through two coated reflecting surfaces. The distance between the reflective coatings determines which wavelengths will destructively interfere and which wavelengths will be allowed to pass through the coated surfaces. In situations where the reflected beams are in phase, the light will pass through the two reflective surfaces. However, if the wavelengths are out of phase, destructive interference will block most of the reflections, allowing almost nothing to transmit through. In this way, interference filters are able to attenuate the intensity of transmitted light at wavelengths that are higher or lower than the desired range. FIG. 4 depicts UV flood lamp set 433, incident light 435, filter 443 and transmitted light 437.

Another filter that can attenuate the wavelengths of the radiation reaching the wafer is the window 343, typically made of quartz. By changing the level of metal impurities and water content, the quartz window can be made to block radiations of undesired wavelengths. High-purity Silica Quartz with very little metal impurity is more transparent deeper into the ultraviolet. As an example, quartz with a thickness of 1 cm will have a transmittance of about 50% at a wavelength of 170 nm, which drops to only a few percent at 160 nm. Increasing levels of impurities in the quartz cause transmission of UV at lower wavelengths to be reduced. Electrically fused quartz has a greater presence of metallic impurities, limiting its UV transmittance wavelength to around 200 nm Synthetic silica, on the other hand, has much greater purity and will transfer down to 170 nm. For infrared radiation, the transmittance through quartz is determined by the water content. More water in the quartz means that infrared radiation is more likely absorbed. The water content in the quartz may be controlled through the manufacturing process. Thus, the spectrum of radiation transmission through the quartz window may be controlled to cutoff or reduce UV transmission at shorter wavelengths and/or to reduce infrared transmission at longer wavelengths.

Another type of filter is UV cut-off filters. These filters do not allow UV transmission below a set value, e.g. 280 nm. These filters work by absorbing wavelengths below the cut-off value. This may be helpful to optimize the desired cure effect.

Radiation wavelength can also be controlled by modifying the properties of the light generator. UV flood lamps can generate a broad spectrum of radiation, from UV to infrared, but other light generators may be used to emit a smaller spectrum or to increase the intensity of a narrower spectrum. Other light generators may be mercury-vapor lamps, doped mercury-vapor lamps, electrode lamps, excimer lamps, excimer lasers, pulsed Xenon lamps, doped Xenon lamps. Lasers such as excimer lasers can emit radiation of a single wavelength. When dopants are added to mercury-vapor and to Xenon lamps, radiation in a narrow wavelength band may be made more intense. Common dopants are iron, nickel, cobalt, tin, zinc, indium, gallium, thallium, antimony, bismuth, or combinations of these. For example, mercury vapor lamps doped with indium emits strongly in the visible spectrum and around 450 nm; iron, at 360 nm; and gallium, at 320 nm. Radiation wavelengths can also be controlled by changing the fill pressure of the lamps. For example, high-pressure mercury vapor lamps can be made to emit wavelengths of 250 to 440 nm, particularly 310 to 350 nm more intensely. Low-pressure mercury vapor lamps emit at shorter wavelengths.

In addition to changing light generator properties and the use of filters, reflectors that preferentially deliver one or more segments of the lamps spectral output may be used. A common reflector is a cold mirror that allows infrared radiation to pass but reflects other light. Other reflectors that preferentially reflect light of a spectral band may be used. Therefore a wafer may be exposed to radiation of different wavelengths at different stations. Of course, the radiation wavelengths may be the same in some stations.

In FIG. 3B, pedestals 323 and 325 are stationary. Indexer 311 lifts and moves each wafer from one pedestal to another between each exposure period. Indexer 311 is an indexer plate 321 attached to a motion mechanism 331 that has rotational and axial motion. Upward axial motion is imparted to indexer plate 321 to pick up wafers from each pedestal. The rotational motion serves to advance the wafers from one station to another. The motion mechanism then imparts downward axial motion to the plate to put the wafers down on the stations.

Pedestals 323 and 325 are electrically heated and maintained at a desired process temperature. Pedestals 323 and 325 may also be equipped with cooling lines, if needed. Each pedestal may have its own heating system. In an alternate embodiment, a large heater block may be used to support the wafers instead of individual pedestals. A thermally conductive gas, such as helium, is used to effect good thermal coupling between the pedestal and the wafer. In some embodiments, cast pedestals with coaxial heat exchangers may be used. These are described in above-referenced application Ser. No. 11/184,101.

FIGS. 3A and 3B show only an example of a suitable apparatus and other apparatuses designed for other methods involved in previous and/or subsequent processes may be used. For example, in another embodiment that uses flood lamps, the wafer support is a carousel. Unlike with the stationary pedestal wafer supports, the wafers do not move relative to the carousel. After a wafer is loaded onto the carousel, the carousel rotates, if necessary, to expose the wafer to light from a UV lamp set. The carousel is stationary during the exposure period. After the exposure period, the carousel rotates to advance each wafer for exposure to the next set of lamps. Heating and cooling elements may be embedded within the rotating carousel. Alternatively the carousel may be in contact with a heater plate or hold the wafers so that they are suspended above a heater plate.

In certain embodiments, the substrates are exposed to UV radiation from focused, rather than, flood lamps. Unlike the flood lamp embodiments wherein the wafers are stationary during exposure (as in FIGS. 3A and b), there is relative movement between the wafers and the light sources during exposure to the focused lights as the wafers are scanned.

Other apparatuses designed for other methods involved in previous and/or subsequent processes may be used. For example, methods of the invention may be used with a standard PECVD chamber used to deposit the precursor layer if the chamber is equipped with a UV radiation source. Some supercritical fluid chamber systems may also be configured to include a UV radiation source. Many of these systems may also be used to perform post-porogen removal procedures. In these cases, the chamber system will likely be pumped out between each of the process operations.

EXAMPLES

Example processes in accordance with the present invention are discussed below. The example processes list parameters of wafer temperature, UV intensity as percentage of full power, desired spectral band as a wavelength range, and gas flow rate for each of stations one to four for a four-station chamber. These example processes are suitable for use in a Novellus SOLA, which uses a four-station sequential processing chamber. These example processes may also be suitable for use in other semiconductor processing equipment, such as ones that use multiple chambers or multi-stations chambers with fewer or more than four stations.

The first example relates to the porous PECVD ULK film embodiment referenced above. Wafers having a porous ULK film deposited thereon are treated with UV radiation first to remove the porogens in the ULK film and then to strengthen and harden the film. Because the porogen becomes harder to remove after the ULK film is hardened and strengthened, the process conditions in the first station must favor porogen removal. In station 1, the wafer is heated to a temperature cooler than stations 2 to 4 because the ULK film hardens and strengthens more at higher temperatures. The UV intensity is lower at station 1, at about 70% of maximum, which may be about 200 to 400 mW/cm$^2$ in the spectrum between 200 and 260 nm. The UV wavelength range at station 1 is about 250-270 nm, a longer wavelength than at stations 2 to 4, which are at about 220-250 nm. As discussed above, the different wavelengths may be achieved using different light generators and optical components. Further, the gas flow rates are higher in stations 1 and 2, at 17 standard liters per minute (slm), than stations 3 and 4, at 8 slm. In one particular implementation of this invention, the higher gas flow purges the porogen from the wafer and inside surfaces of the chamber. By the time the wafer reaches stations 3 and 4, most of the porogen has generally been removed, and less purging is required. The different gas flow rates may be accomplished by using different mass flow controllers (MFCs) from the same gas inlet header, or, in some instances when different gases are required in each station, different gas inlet headers. In this example, station 1 differs from stations 3 and 4 in every process parameter, but is different from station 2 by three process parameters. On the other hand, only the purge gas flow rate is different as between station 2 and stations 3 and 4. Argon is a suitable purge gas, but helium or a mixture of argon and helium may be used. Process parameters are summarized in Table 1.

TABLE 1

Process Example for Porous PECVD ULK Film

| Parameter | Station #1 | Station #2 | Station #3 | Station #4 |
|---|---|---|---|---|
| Wafer Temperature | 375° C. | 400° C. | 400° C. | 400° C. |
| UV Intensity (% of full power) | 70% | 100% | 100% | 100% |
| Desired Spectral band | 250-270 nm | 220-250 nm | 220-250 nm | 220-250 nm |
| Gas Flow Rate | 10-25 slm | 10-25 slm | 5-12 slm | 5-12 slm |

As another example, a silicon nitride film may be treated to increase tensile stress in accordance with the present invention. For certain applications, silicon nitride may be used in place of silicon dioxide for top layer protection because it is harder and has better hermeticity, etch selectivity, and protects regions below it against oxidation. Silicon nitride films may be deposited with a LPCVD (low-pressure chemical vapor deposition) or a PECVD (plasma-enhanced chemical vapor deposition) process. UV radiation may be used to change the stress properties of the silicon nitride film, generally to increase its tensile stress. This tensile stress increase can be performed in two operations. In this example, the wafer is heated to 400° C., in some cases up to 480° C., in the first station, while the UV intensity is at the maximum, about 200 to 400 mW/cm². The UV wavelength range is about 220-250 nm, similar to that for building ULK film strength and hardness. The gas flow is at 4 slpm. In stations 2 to 4, the wafer is heated to 415° C., and all the other parameters are kept about the same. Process parameters are summarized in Table 2.

TABLE 2

Process Example for High Tensile Nitride Film

| Parameter | Station #1 | Station #2 | Station #3 | Station #4 |
|---|---|---|---|---|
| Wafer Temperature | 400° C. | 415° C. | 415° C. | 415° C. |
| UV Intensity (% of full power) | 100% | 100% | 100% | 100% |
| Desired Spectral band | 220-250 nm | 220-250 nm | 220-250 nm | 220-250 nm |
| Gas Flow Rate | 2-6 slm | 2-6 slm | 2-6 slm | 2-6 slm |

In yet another example, a spin-on ULK film may be treated with UV radiation first to evolve the solvent and then to harden and strengthen the film. As its name states, the spin-on ULK film is applied to the wafer via a spinning process. First a liquid solution containing the film is applied to the wafer, and the wafer is spun to evenly spread the liquid solution to all parts of the wafer. UV radiation can be applied to the deposited film to drive-off the solvent; complete chemical reactions; drive off unreacted monomers and oligomers; and to densify the film. These processes may be achieved in three operations. In the first station, the wafer temperature is kept at about 350° C., a little lower than stations 2 to 4, which are kept at 400° C. The intensity is also lower at station 1, at about 70% of the maximum, which may be about 200 to 400 mW/cm². The UV wavelength range is at about 300-400 nm, which is longer than the 220-250 nm used in stations 2 to 4. In station 1, most the solvent is evolved from the spin-on ULK film. Premature hardening may trap some solvents and stop chemical reactions; therefore, station 1 parameters favor solvent evolution and not film hardening or strengthening. The purge gas flows at a high rate, 17 slm, to remove all the solvents evolved from the film. In station 2, the purge gas flow is still high, but the wafer temperature, UV intensity and wavelength, are all changed to the parameters that favor film hardening and strengthening. In this station, any remaining unreacted monomers and oligomers are removed under high purge gas flow. In stations 3 and 4, the purge gas flow is reduced to 8 slm while the other parameters remain constant. This example is similar to that of the porous ULK film example in Table 1, which also has three distinct stages. Process parameters are summarized in Table 3.

TABLE 3

Process Example for Spin-on ULK Film

| Parameter | Station #1 | Station #2 | Station #3 | Station #4 |
|---|---|---|---|---|
| Wafer Temperature | 350° C. | 400° C. | 400° C. | 400° C. |
| UV Intensity (% of full power) | 70% | 100% | 100% | 100% |
| Desired Spectral band | 300-400 nm | 220-250 nm | 220-250 nm | 220-250 nm |
| Gas Flow Rate | 10-25 slm | 10-25 slm | 5-12 slm | 5-12 slm |

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The use of the singular in the claims does not mean "only one," but rather "one or more," unless otherwise stated in the claims.

What is claimed is:

1. A chamber for processing semiconductor wafers, comprising:
    a plurality of processing stations, each processing station having a wafer support, a radiation source, and a window disposed between the wafer support and the radiation source; and
    a mechanism to transfer a wafer to each processing station, wherein the stations are configured to:
        expose a wafer supported by the wafer support to radiation from the radiation source, and
        provide wafer exposure characteristics that vary radiation wavelength for at least two of the plurality of stations.

2. The chamber of claim 1, wherein each radiation source comprises
    a) one or more light generators,
    b) one or more optical components operable to modify one or more characteristics of radiant output of the light generators.

3. The chamber of claim 2, wherein the one or more light generators are operable to generate light having a wavelength or wavelengths between 150 nm and 500 nm.

4. The chamber of claim 2, wherein the one or more light generators are selected from the group consisting of mercury-vapor lamps, doped mercury-vapor lamps, electrode lamps, excimer lamps, excimer lasers, pulsed Xenon lamps, doped Xenon lamps, and combinations thereof.

5. The chamber of claim 2, wherein the one or more optical components are selected from the group consisting of one or more reflectors, one or more filters, or a combination thereof.

6. The chamber of claim 5 wherein at least one of the one or more reflectors is selected to reflect only radiation of a desired wavelength range.

7. The chamber of claim 5, wherein at least one of the one or more filters is a bandpass filter selected to transmit only radiation of a desired wavelength range.

8. The chamber of claim 5, wherein the one or more filters comprises a quartz window.

9. The chamber of claim 8, wherein the purity of the quartz window is selected to filter out radiation within a wavelength range from passing through the window and transmit radiation outside of the wavelength range through the window.

10. The chamber of claim 5, wherein the filter is a long pass filter selected to filter out radiation with a wavelength below a cutoff wavelength.

11. The chamber of claim 1 further comprising a mechanism for controlling the temperature of the wafer independent of the intensity of the radiation.

12. The chamber of claim 11, wherein the mechanism is a temperature-controlled wafer support.

13. The chamber of claim 12, wherein the wafer support is heated.

14. The chamber of claim 12, wherein the wafer support is cooled.

15. The chamber of claim 1, wherein the radiation source in each processing station is centered with respect to the perimeter of the wafer support.

16. The chamber of claim 1, wherein each of the plurality of processing stations further comprises a reflector disposed over the radiation source, and wherein the radiation source and the reflector are disposed within the processing station such that a wafer supported by the wafer support and centered with respect to the perimeter of the wafer support is exposed to substantially uniform radiation from the radiation source across the wafer surface.

17. A chamber for processing semiconductor wafers, comprising:
 a plurality of processing stations, each processing station having a wafer support, a radiation source, and a mechanism configured to transfer wafers to and from each station;
 wherein each processing stations is configured to expose a wafer supported by the wafer support of the processing station to radiation from the radiation source of the processing station and provide wafer exposure characteristics that vary in radiation wavelength between at least two of the processing stations;
 and wherein the radiation source is disposed within the processing station such that the wafer supported by the wafer support, when centered with respect to the perimeter of the wafer support, is exposed to substantially uniform radiation across a surface of the wafer.

18. A chamber for processing semiconductor wafers, comprising:
 a first station comprising a first wafer support, a first radiation source, and a first window disposed between the first wafer support and the first radiation source; wherein the first radiation source and the first window are configured to expose a wafer on the first wafer support to radiation at a first intensity;
 a second station comprising a second wafer support, a second radiation source, and a second window disposed between the second wafer support and the second radiation source; wherein the second radiation source and the second window is operable to expose a wafer on the second wafer support to radiation at a second intensity; wherein the second intensity is between about 50%-90% of the first intensity; and
 a mechanism to transfer a wafer to each station.

19. The chamber of claim 1, wherein the mechanism is configured to transfer the wafer to each processing station by at least rotating about a rotational axis and keeping the wafer a fixed distance from the rotational axis during the rotation and from station to station.

20. The chamber of claim 19, wherein the mechanism is a carousel.

21. The chamber of claim 1, wherein the chamber is configured to simultaneously expose wafers supported by the wafer supports to radiation.

22. The chamber of claim 1, wherein radiation sources are each configured to expose the same side of the wafer to radiation.

* * * * *